(12) United States Patent
Sato

(10) Patent No.: US 8,121,168 B2
(45) Date of Patent: Feb. 21, 2012

(54) MULTIBEAM LASER DIODE

(75) Inventor: Shinya Sato, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/458,565

(22) Filed: Jul. 16, 2009

(65) Prior Publication Data
US 2010/0046563 A1 Feb. 25, 2010

(30) Foreign Application Priority Data
Aug. 22, 2008 (JP) ................................. 2008-214701

(51) Int. Cl.
*H01S 5/00* (2006.01)

(52) U.S. Cl. ............... 372/50.121; 372/50.12; 372/50.1; 372/38.05

(58) Field of Classification Search ............... 372/50.12, 372/50.121, 50.1, 38.05
See application file for complete search history.

(56) References Cited

U.S. PATENT DOCUMENTS

| | | | |
|---|---|---|---|
| 6,444,998 B1 | 9/2002 | Taniguchi et al. | |
| 2004/0052288 A1 * | 3/2004 | Barbier et al. | 372/97 |
| 2006/0007977 A1 | 1/2006 | Nakatsuka | |
| 2006/0227838 A1 * | 10/2006 | Hata et al. | 372/50.124 |

FOREIGN PATENT DOCUMENTS

| | | |
|---|---|---|
| JP | 58-122472 U | 8/1983 |
| JP | 63-199479 A | 8/1988 |
| JP | 07-147453 A | 6/1995 |
| JP | 11-135893 A | 5/1999 |
| JP | 11-145567 A | 5/1999 |
| JP | 2000-269601 | 9/2000 |
| JP | 2002-344084 A | 11/2002 |
| JP | 2004-087866 A | 3/2004 |
| JP | 2004-140141 A | 5/2004 |
| JP | 2005-045146 A | 2/2005 |
| JP | 2005-101483 A | 4/2005 |
| JP | 2005101483 A * | 4/2005 |
| JP | 2006-024665 | 1/2006 |
| JP | 2006-278576 A | 10/2006 |
| JP | 2007-048810 A | 2/2007 |
| JP | 2007-173402 A | 7/2007 |

OTHER PUBLICATIONS

English Translation of Japanese Office Action issued Jun. 15, 2010 for corresponding Japanese Application No. 2008-214701.

* cited by examiner

*Primary Examiner* — Kinam Park
(74) *Attorney, Agent, or Firm* — Rader, Fishman & Grauer PLLC

(57) ABSTRACT

A multibeam laser diode capable of improving heat release characteristics in the case of junction-down assembly is provided. Contact electrodes are provided respectively for protruding streaks of a laser diode device, and pad electrodes are provided to avoid the protruding streaks and the contact electrodes. The contact electrodes and the pad electrodes are connected by wiring electrodes, and the contact electrodes are covered with a first insulating film. Thereby, electric connection is enabled without straightly jointing the contact electrodes to a solder layer. A heat conduction layer configured of a metal is provided on the first insulating film, the heat conduction layer is jointed to the solder layer, and thereby the heat release characteristics are able to be improved even in the case of junction-down assembly.

16 Claims, 39 Drawing Sheets

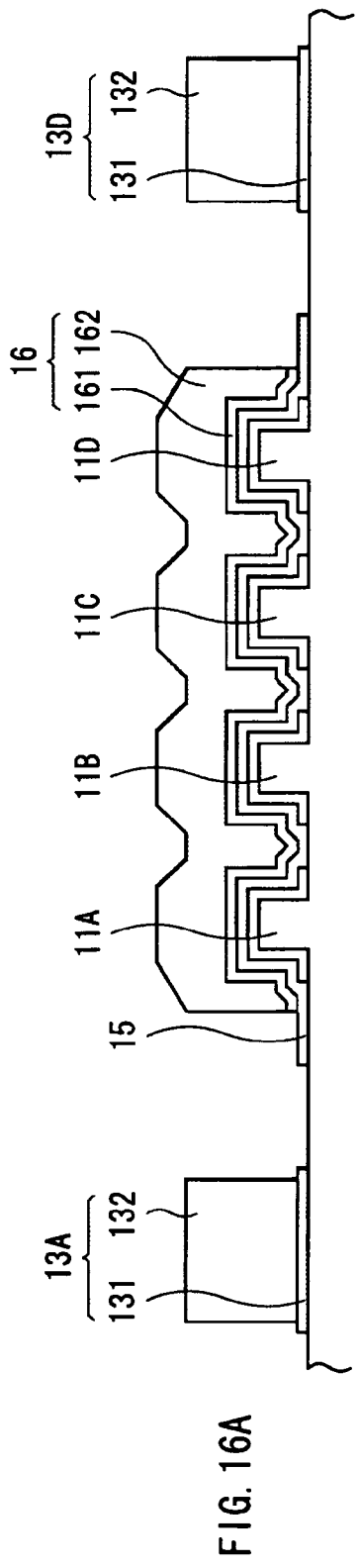
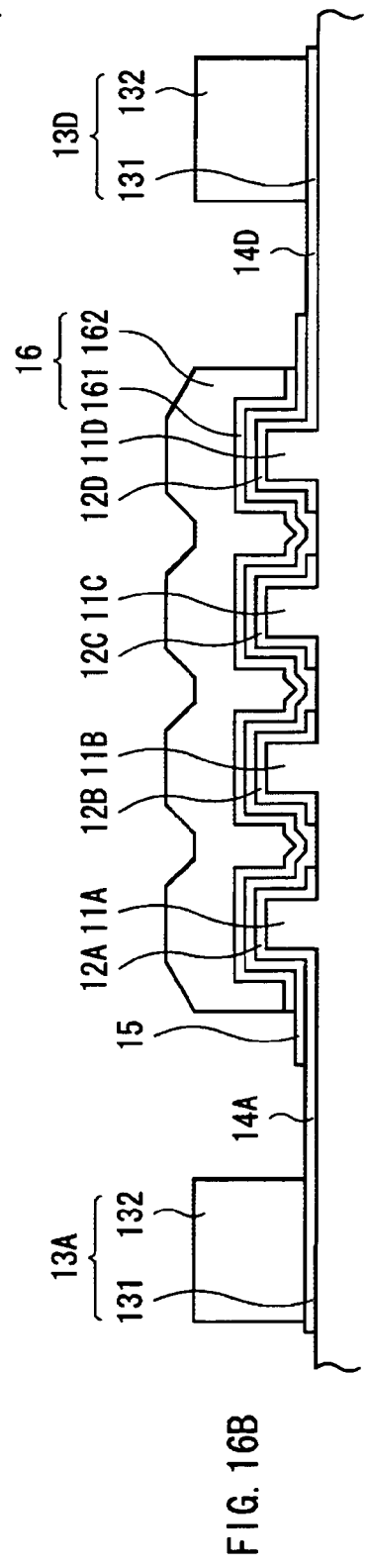
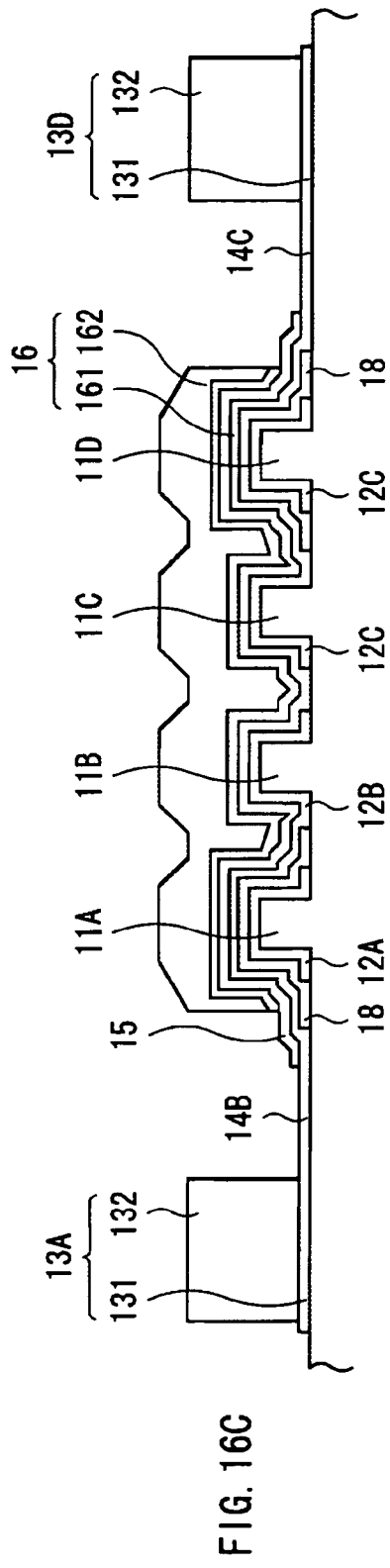
FIG. 16A
FIG. 16B
FIG. 16C

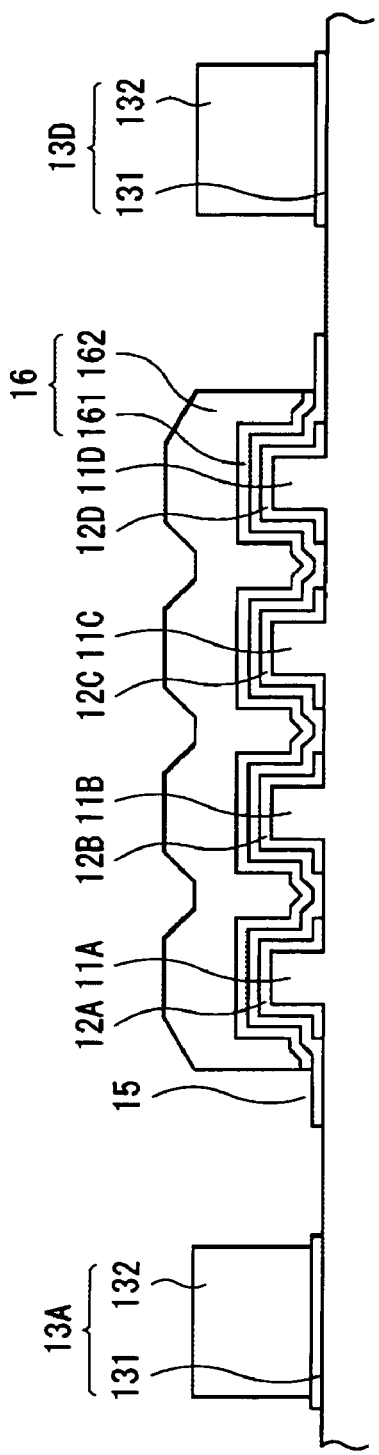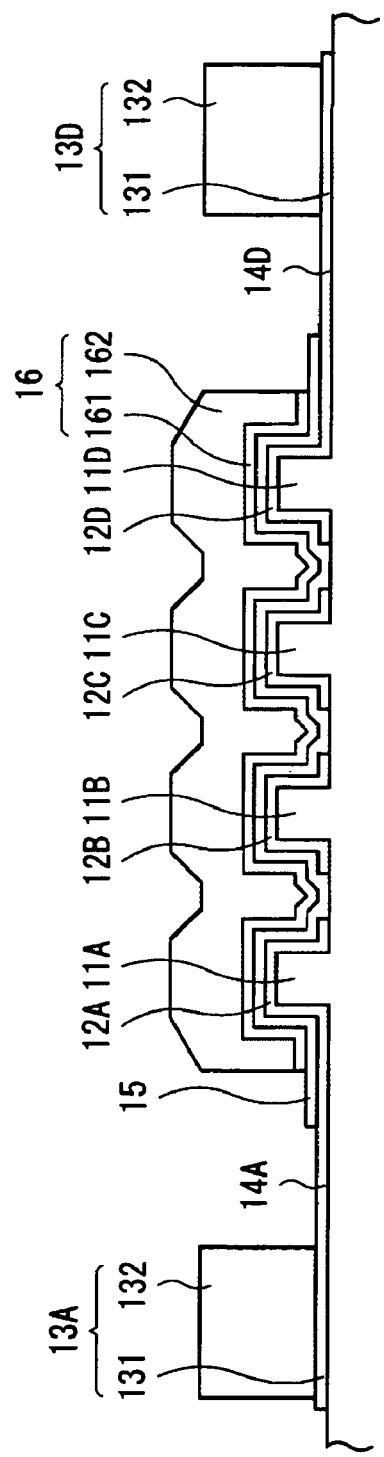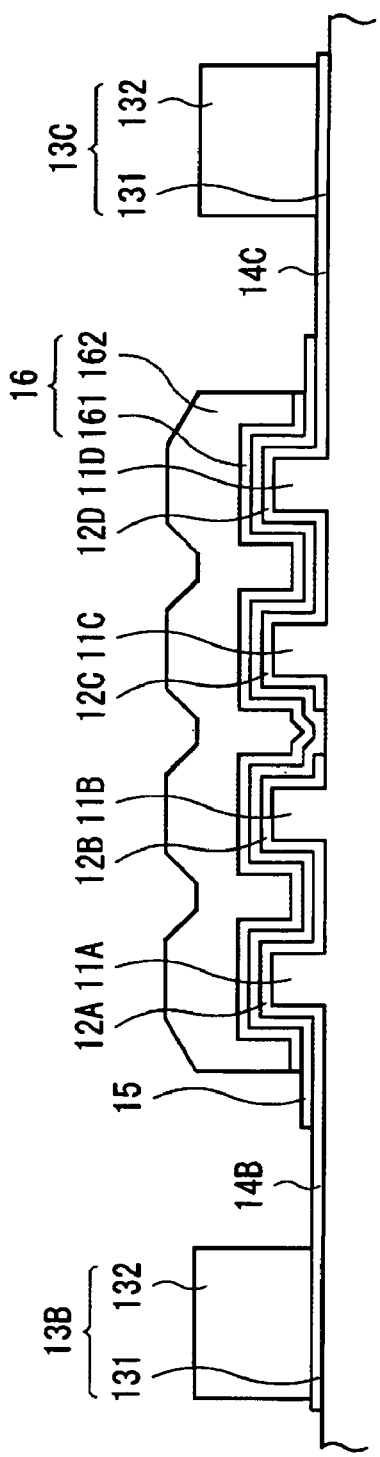

MULTIBEAM LASER DIODE

BACKGROUND OF THE INVENTION

1. Field of the Invention

The present invention relates to a multibeam laser diode radiating a plurality of laser lights from one light emitting device.

2. Description of the Related Art

In a multibeam laser diode, junction-down assembly advantageous to heat release is desirable. However, in the case where the beam interval is small, the width of the electrode and the width of the solder layer become small, and junction-down assembly is hardly realized because of the following reason. That is, in junction-down assembly, a contact electrode in a state of stripe is provided on the device side, and a solder layer in a state of stripe similar to that on the device side is provided on the submount (support) side. By jointing the contact electrode to the solder layer, electric contact is obtained. In this method, depending on mounting precision in solder joint, for example, the following concerns exist: 1. leakage; 2. deterioration of heat release characteristics; and 3. nonuniform solder joint stress is applied to the stripe.

"1. leakage" is generated in the case where in jointing, the solder extends over the next contact electrode. Such leakage becomes a large disadvantage as the pitch becomes smaller or the number of beams becomes larger. "2. deterioration of heat release characteristics" is caused by difference of solder joint state between beams. As the width of the electrode and the width of the solder layer become smaller, the tolerance range of mounting precision becomes smaller. Thus, if the mounting position is shifted even slightly, joint state with the solder differs according to each beam. "3. nonuniform solder joint stress is applied to the stripe" is also caused by mounting position shift. If the solder is jointed while position shift with respect to the stripe is left, nonuniform joint stress is applied to the stripe, which affects polarization characteristics and reliability.

To resolve the foregoing disadvantages, for example, in Japanese Unexamined Patent Application Publication No. 2000-269601, the following structure is disclosed. In the structure, in the case of junction-up assembly, by providing a high-resistivity isolation region between light emitting devices of a multibeam laser diode equipment, short circuit between the light emitting devices due to destruction of an interlayer insulating film in bonding is prevented. Further, for example, in Japanese Unexamined Patent Application Publication No. 2006-24665, the following structure is disclosed. In the structure, in the case of junction-down assembly, an insulating film is formed on a first electrode covering stripe, a second electrode is formed in an aperture provided in the insulating film, and thereby the first electrode and the second electrode are electrically connected, and the second electrode is jointed to a submount by solder.

SUMMARY OF THE INVENTION

However, in the case where the structure of Japanese Unexamined Patent Application Publication No. 2000-269601 is applied to junction-down assembly, the solder layer and the electrode on the stripe are not jointed, and there is a concern that heat release characteristics are deteriorated, leaving a room for improvement. Further, in Japanese Unexamined Patent Application Publication No. 2006-24665, there are disadvantages that solder joint stress is applied to stripe, which affects polarization characteristics, and highly accurate mounting position precision is necessitated.

In view of such disadvantages, in the invention, it is desirable to provide a multibeam laser diode capable of improving heat release characteristics in the case of junction-down assembly.

According to an embodiment of the invention, there is provided a multibeam laser diode including the following components A to F:

A: a laser diode device having a plurality of protruding streaks;
B: a contact electrode provided respectively for the plurality of protruding streaks;
C: a plurality of pad electrodes provided to avoid the plurality of protruding streaks on a face, on which the plurality of protruding streaks are formed, of the laser diode device;
D: a wiring electrode that connects the contact electrode to one or more of the plurality of pad electrodes;
E: a first insulating film on the contact electrode; and
F: a heat conduction layer configured of a metal that is provided on the first insulating film.

In the multibeam laser diode, the contact electrode is connected to the pad electrode by the wiring electrode, and is covered with the first insulating film. Thus, the contact electrode is driven through the pad electrode and the wiring electrode without straightly jointing the contact electrode to a solder layer. Further, the heat conduction layer configured of a metal is provided on the first insulating film. Thus, heat generated in the laser diode device is released to the solder layer and the support through the heat conduction layer.

According to the multibeam laser diode of the embodiment of the invention, the contact electrode is connected to the pad electrode by the wiring electrode, and is covered with the first insulating film. Thus, electric connection is enabled without straightly jointing the contact electrode to a solder layer. Further, the heat conduction layer configured of a metal is provided on the first insulating film. Thus, by jointing the heat conduction layer to the solder layer, in the case of junction-down assembly, the heat release characteristics are able to be improved.

Other and further objects, features and advantages of the invention will appear more fully from the following description.

BRIEF DESCRIPTION OF THE DRAWINGS

FIG. 16A is a cross sectional view taken along line XVIA-XVIA of FIG. 15, FIG. 16B is a cross sectional view taken along line XVIB-XVIB of FIG. 15, and FIG. 16C is a cross sectional view taken along line XVIC-XVIC of FIG. 15;

FIG. 30A is a cross sectional view taken along line XXXA-XXXA of FIG. 29, FIG. 30B is a cross sectional view taken along line XXXB-XXXB of FIG. 29, and FIG. 30C is a cross sectional view taken along line XXXC-XXXC of FIG. 29;

DETAILED DESCRIPTION OF THE PREFERRED EMBODIMENTS

Embodiments of the invention will be hereinafter described in detail with reference to the drawings. The description will be given in the following order.
1. First embodiment (two beam laser)
2. Second embodiment (four beam laser: example of a case that a second insulating film is provided between a contact electrode and a wiring electrode)
3. Third embodiment (four beam laser: example of a case that a wiring electrode is formed in a high-resistivity region)

1. First Embodiment

Structure of Multibeam Laser Diode

Figure 1:
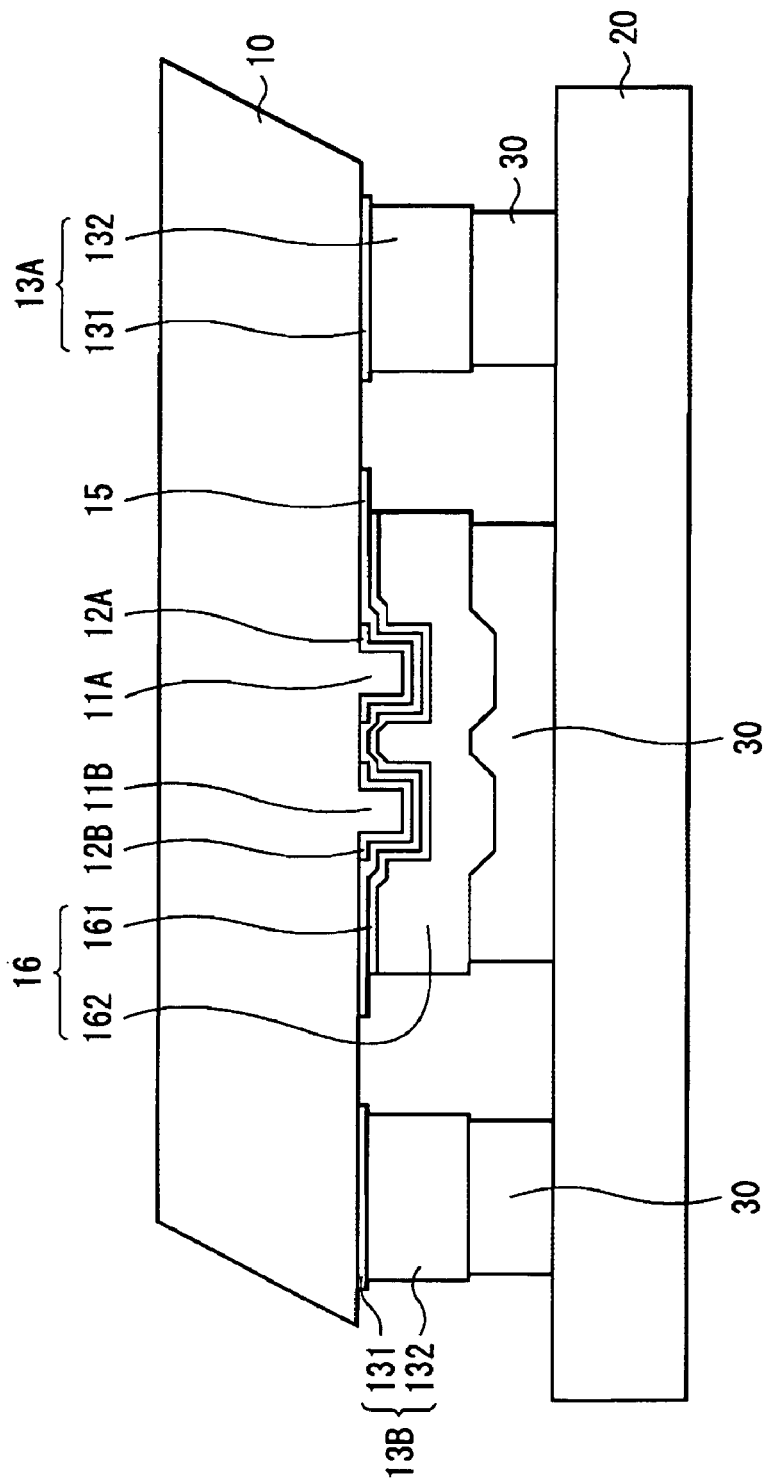
FIG. 1 is a cross sectional view illustrating a structure of a multibeam laser diode according to a first embodiment of the invention.

FIG. 1 illustrates a longitudinal cross sectional structure of a multibeam laser diode according to a first embodiment of the invention. The multibeam laser diode is used as, for example, a light source for a printer or the like. For example, the multibeam laser diode has a multibeam laser diode device 10 in which two protruding streaks (stripes) 11A and 11B are formed on one face. The lengths (resonator length) of the protruding streaks (stripes) 11A and 11B are, for example, about from 400 µm to 500 µm both inclusive. The laser diode device 10 is jointed to a support 20 by a solder layer 30 in a state of junction-down that the face on which the protruding streaks 11A and 11B are formed is opposed to the support (submount) 20.

Figure 2:
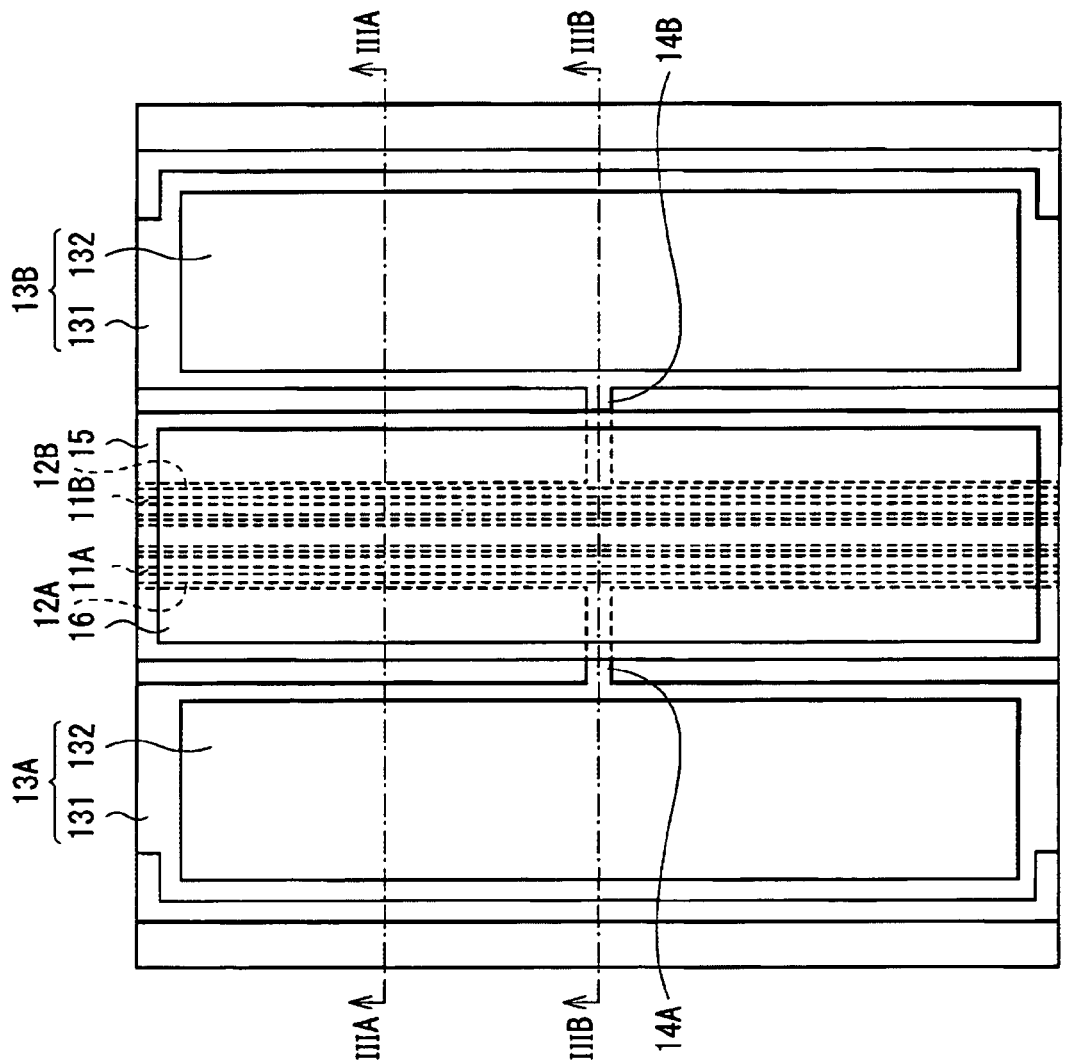
FIG. 2 is a plan view illustrating a structure viewed from the side of the face, on which protruding streaks are formed, of the multibeam laser diode illustrated in FIG. 1.
Figure 3:
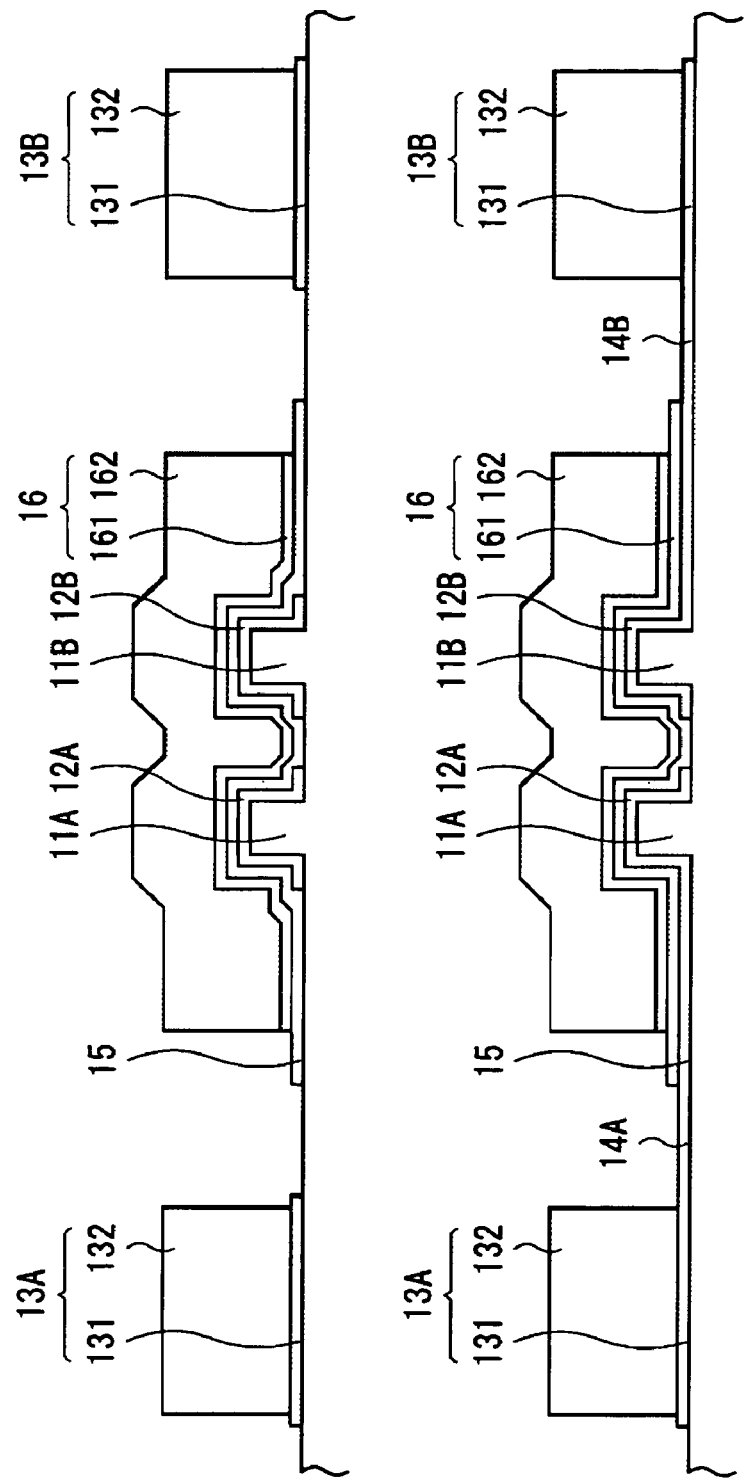
FIG. 3A is a cross sectional view taken along line IIIA-IIIA of FIG. 2.
FIG. 3B is a cross sectional view taken along line IIIB-IIIB of FIG. 2.

FIG. 2 illustrates a planar structure viewed from the side of the face on which the protruding streaks 11A and 11B are formed of the multibeam laser diode illustrated in FIG. 1. FIG. 3A illustrates a cross sectional structure taken along line IIIA-IIIA of FIG. 2, and FIG. 3B illustrates a cross sectional structure taken along line IIIB-IIIB of FIG. 2.

For example, the laser diode device 10 has contact electrodes 12A and 12B and pad electrodes 13A and 13B on the face on which the protruding streaks 11A and 11B are formed. The contact electrodes 12A and 12B are respectively provided for the protruding streaks 11A and 11B. Meanwhile, the pad electrodes 13A and 13B are provided to avoid the protruding streaks 11A and 11B and the contact electrodes 12A and 12B. The contact electrode 12A and the pad electrode 13A are connected by a wiring electrode 14A. The contact electrode 12B and the pad electrode 13B are connected by a wiring electrode 14B. A first insulating film 15 is formed on the contact electrodes 12A and 12B. A heat conduction layer 16 made of a metal is provided on the first insulating film 15. Thereby, in the multibeam laser diode, in the case of junction-down assembly, the heat release characteristics are able to be improved.

The contact electrodes 12A and 12B have a structure in which, for example, a titanium (Ti) layer having a thickness in the lamination direction (hereinafter simply referred to as "thickness") of 50 nm, a platinum (Pt) layer having a thickness of 100 nm, and a gold (Au) layer having a thickness of 300 nm are sequentially layered.

The pad electrodes 13A and 13B have a laminated structure configured of, for example, a lower pad electrode 131 and an upper pad electrode 132. The lower pad electrode 131 has a structure in which, for example, a titanium (Ti) layer having a thickness of 50 nm, a platinum (Pt) layer having a thickness of 100 nm, and a gold (Au) layer having a thickness of 300 nm are sequentially layered. The upper pad electrode 132 is configured of, for example, a gold plated layer having a thickness of 3 μm.

The wiring electrodes 14A and 14B have a structure in which, for example, a titanium (Ti) layer having a thickness of 50 nm, a platinum (Pt) layer having a thickness of 100 nm, and a gold (Au) layer having a thickness of 300 nm are sequentially layered.

The first insulating film 15 is intended to decrease solder joint stress applied to the protruding streaks 11A and 11B by preventing the contact electrodes 12A and 12B from being straightly jointed to the solder layer 30. The thickness of the first insulating film 15 is preferably, for example, about 100 nm. As the first insulating film 15 is thinner, heat release characteristics are able to be more improved. The first insulating film 15 is preferably configured of, for example, one or more selected from the group consisting of AlN, SiC, diamond, BN, $SiO_2$, and SiN.

The heat conduction layer 16 has a laminated structure configured of, for example, a lower heat conduction layer 161 and an upper heat conduction layer 162. The lower heat conduction layer 161 has a structure in which, for example, a titanium (Ti) layer having a thickness of 50 nm, a platinum (Pt) layer having a thickness of 100 nm, and a gold (Au) layer having a thickness of 300 nm are sequentially layered. The upper heat conduction layer 162 is configured of, for example, a gold plated layer having a thickness of 3 μm.

The contact electrodes 12A and 12B, the lower pad electrode 131 of the pad electrodes 13A and 13B, and the wiring electrodes 14A and 14B have the same laminated structure, and are formed in the same step in the after-mentioned manufacturing step. Further, the upper pad electrode 132 of the pad electrodes 13A and 13B and the upper heat conduction layer 162 of the heat conduction layer 16 are configured of the same gold plated layer, and are formed in the same step in the after-mentioned manufacturing step.

On the pad electrodes 13A and 13B and the heat conduction layer 16, another metal layer 17 (not illustrated in FIG. 2, and refer to FIG. 13) may be further formed. The metal layer 17 is intended to prevent variation of melting point and improve wetting characteristics of the solder layer 30 by uniformalizing composition after alloying of the upper pad electrode 132/the upper heat conduction layer 162 configured of the metal plated layer and the solder layer 30. The component material and the laminated structure of the metal layer 17 are not particularly limited as long as no reaction is initiated with the upper pad electrode 132 and the upper heat conduction layer 162 configured of the metal plated layer. For example, the metal layer 17 may have a structure in which, for example, a titanium (Ti) layer having a thickness of 50 nm, a platinum (Pt) layer having a thickness of 100 nm, and a gold (Au) layer having a thickness of 300 nm are sequentially layered.

The contact electrodes 12A and 12B preferably have a symmetrical width with respect to the protruding streaks 11A and 11B. By providing the contact electrodes 12A and 12B, stress applied to the protruding streaks 11A and 11B is able to be decreased.

The first insulating film 15 and the heat conduction layer 16 preferably have a width wider than the width of the protruding streaks 11A and 11B and the width of the contact electrodes 12A and 12B. Specifically, the first insulating film 15 and the heat conduction layer 16 preferably have a width capable of covering the whole protruding streaks 11A and 11B and the whole contact electrodes 12A and 12B. Thereby, joint stress between the heat conduction layer 16 and the solder layer 30 applied to the respective protruding streaks 11A and 11B is able to be uniformalized and decreased.

Figure 4:
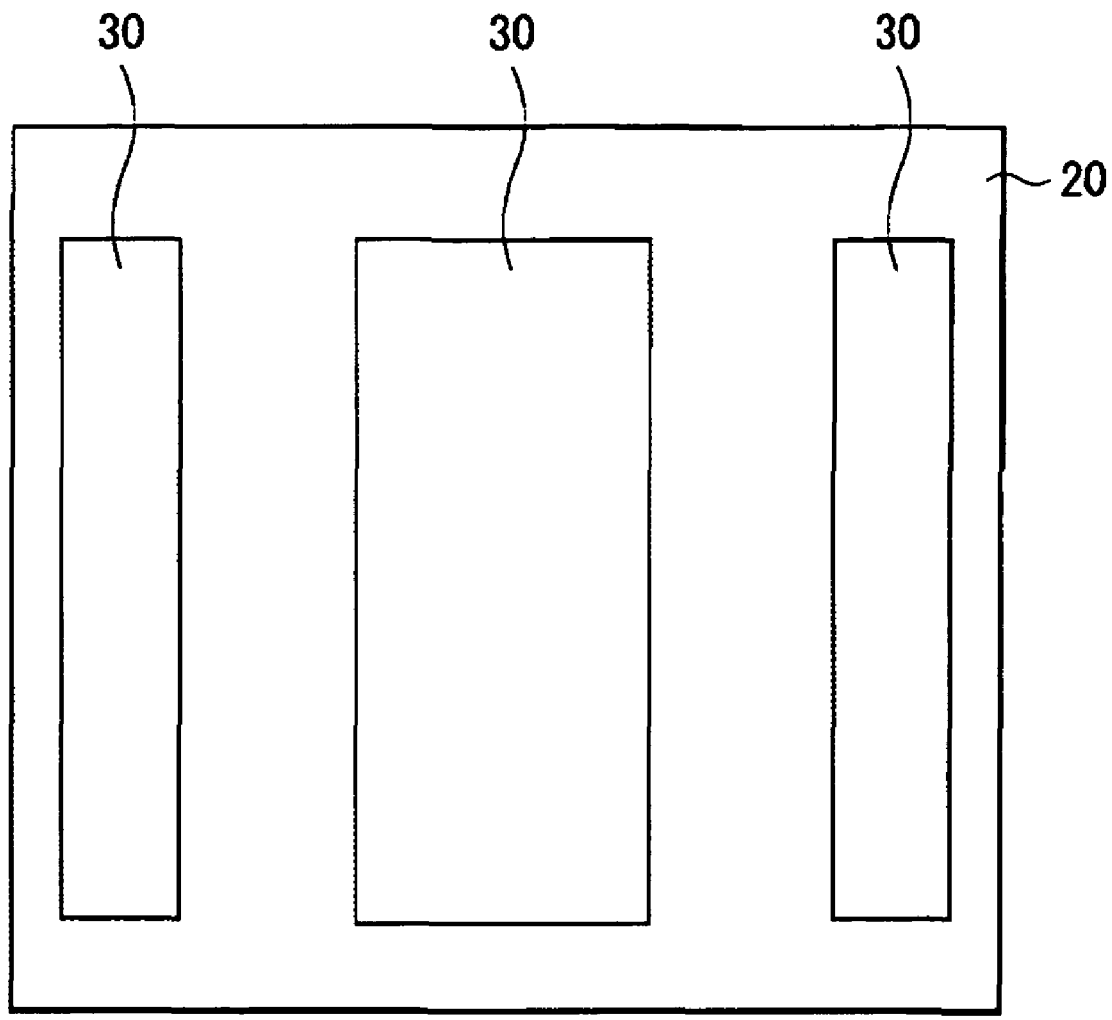
FIG. 4 is a plan view illustrating a structure viewed from the side of the face, on which a solder layer is formed, of the support illustrated in FIG. 1.

FIG. 4 illustrates a structure viewed from the side of the face on which the solder layer 30 is formed, of the support 20. The support 20 is configured of, for example, AlN, and is arranged on a package (not illustrated). The solder layer 30 is provided between the support 20 and the pad electrodes 13A and 13B and between the support 20 and the heat conduction layer 16. The solder layer 30 is configured of, for example, gold (Au)-tin (Sn) solder.

Structural Example of Laser Diode Device

Figure 5:
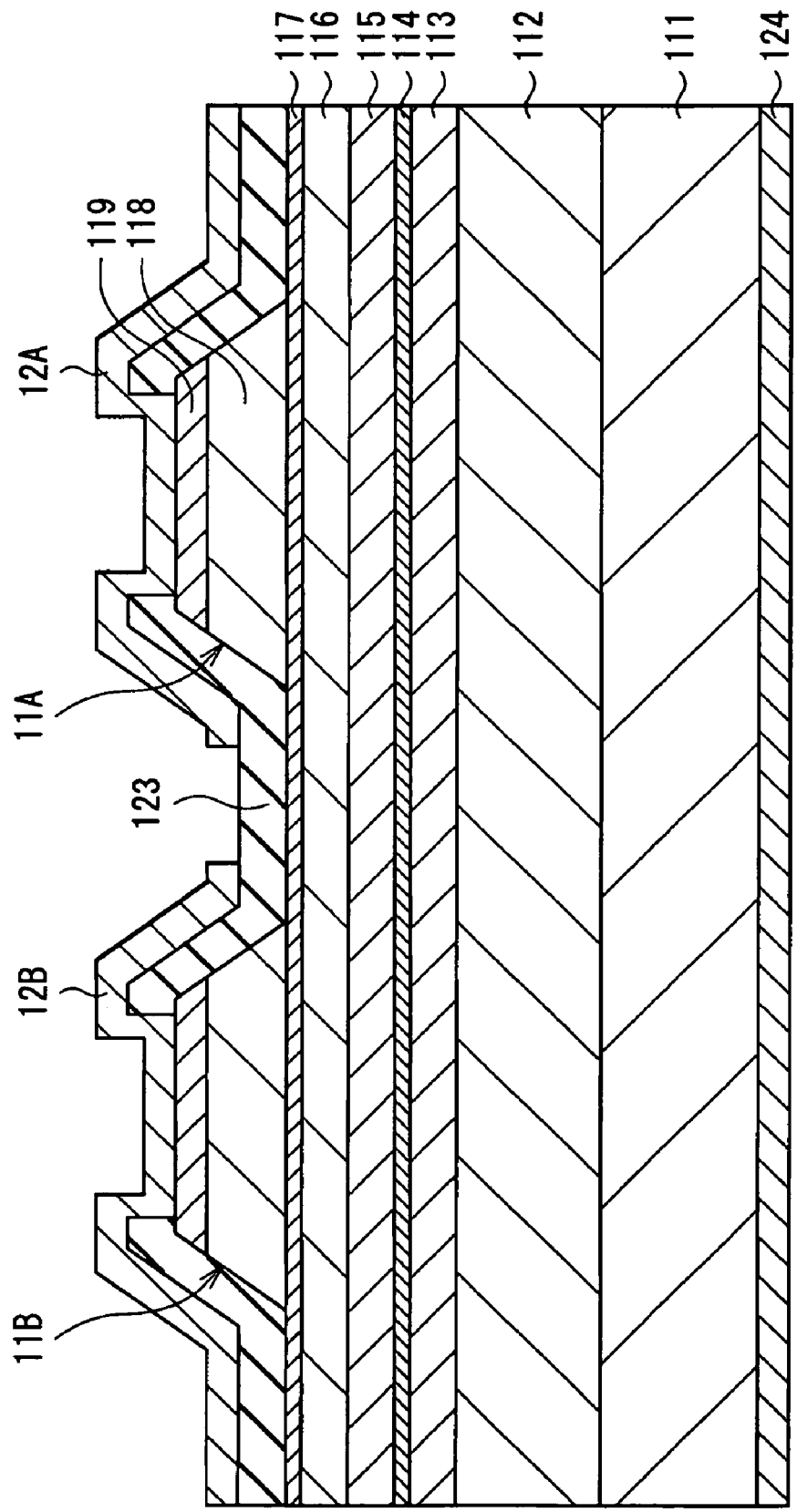
FIG. 5 is a cross sectional view illustrating an example of the laser diode device illustrated in FIG. 1.

FIG. 5 illustrates an example of the laser diode device 10 illustrated in FIG. 1. The laser diode device 10 has a structure in which, for example, on one face side of a substrate 111, an n-type cladding layer 112, a first guiding layer 113, an active layer 114, a second guiding layer 115, a first p-type cladding layer 116, an etching stop layer 117, a second p-type cladding layer 118, and a p-side contact layer 119 are layered in this order. The substrate 111 has, for example, a thickness in the lamination direction (hereinafter simply referred to as thickness) of 110 μm. The substrate 111 is configured of n-type GaAs doped with n-type impurity such as silicon (Si) or selenium (Se).

The n-type cladding layer 112 has, for example, a thickness of 2.0 μm, and is configured of an n-type $Al_{0.5}In_{0.5}P$ mixed crystal doped with n-type impurity such as silicon or selenium.

The first guiding layer 113 has, for example, a thickness of 120 nm, and is configured of an $Al_{0.3}Ga_{0.2}In_{0.5}P$ mixed crystal. The first guiding layer 113 may not necessarily contain impurity, or may be doped with n-type impurity such as silicon or selenium.

The active layer 114 has, for example, a thickness of 12 nm, and is configured of a GaInP mixed crystal. The composition of indium contained in the active layer 114 is preferably, for example, from 0.2 to 0.8 both inclusive, and is more preferably about 0.5, since thereby lattice fit with GaAs as the component of the substrate 111 is able to be made.

The second guiding layer 115 has, for example, a thickness of 120 nm, and is configured of an $Al_{0.3}Ga_{0.2}In_{0.5}P$ mixed crystal. The second guiding layer 115 may not necessarily contain impurity, or may be doped with p-type impurity such as zinc (Zn) or magnesium (Mg).

The first p-type cladding layer 116 has, for example, a thickness of 0.4 μm, and is configured of a p-type $Al_{0.5}In_{0.5}P$ mixed crystal doped with p-type impurity such as zinc or magnesium. The etching stop layer 117 is intended to inhibit variation of the thickness of the first p-type cladding layer 116 in the after-mentioned manufacturing step. The etching stop layer 117 has, for example, a thickness of 15 nm, and is configured of p-type GaInP doped with p-type impurity such as zinc or magnesium. The second p-type cladding layer 118 has, for example, a thickness of 1.6 μm, and is configured of a p-type $Al_{0.5}In_{0.5}P$ mixed crystal doped with p-type impurity such as zinc or magnesium. The p-side contact layer 119 has, for example, a thickness of 0.3 μm, and is configured of p-type GaAs doped with p-type impurity such as zinc or magnesium.

Of the foregoing, the second p-type cladding layer 118 and the p-side contact layer 119 are extended in a state of a narrow strip-shape (in FIG. 5, strip shape extending in the direction perpendicular to the page space), which corresponds to the foregoing protruding streaks 11A and 11B. The protruding streaks 11A and 11B limit a current injection region of the active layer 114. A section of the active layer 114 corresponding to the protruding streaks 11A and 11B is the current injection region.

On the p-side contact layer 119, the foregoing contact electrodes 12A and 12B are formed with an insulating layer 123 configured of, for example, silicon dioxide ($SiO_2$) or silicon nitride (SiN) in between. Meanwhile, on the rear face of the substrate 111, an n-side electrode 124 is formed. The n-side electrode 124 has a structure in which, for example, AuGe:Ni and gold (Au) are sequentially layered, which is alloyed by heat treatment. The n-side electrode 124 is electrically connected to the substrate 111.

In the laser diode device 10, for example, a pair of side faces opposed to each other in the length direction of the protruding streaks 11A and 11B is resonator end faces. On the pair of resonator end faces, a pair of reflector films (not illustrated) is respectively formed. Of the pair of reflector films, one reflector film has reflectance adjusted low, the other reflector film has reflectance adjusted high. Thereby, light generated in the active layer 114 shuttles between the pair of reflector films so as to be amplified, and emitted as a laser beam from one of the reflector films.

Method of Manufacturing Multibeam Laser Diode

The multibeam laser diode is able to be manufactured by, for example, as follows.

Figure 6:
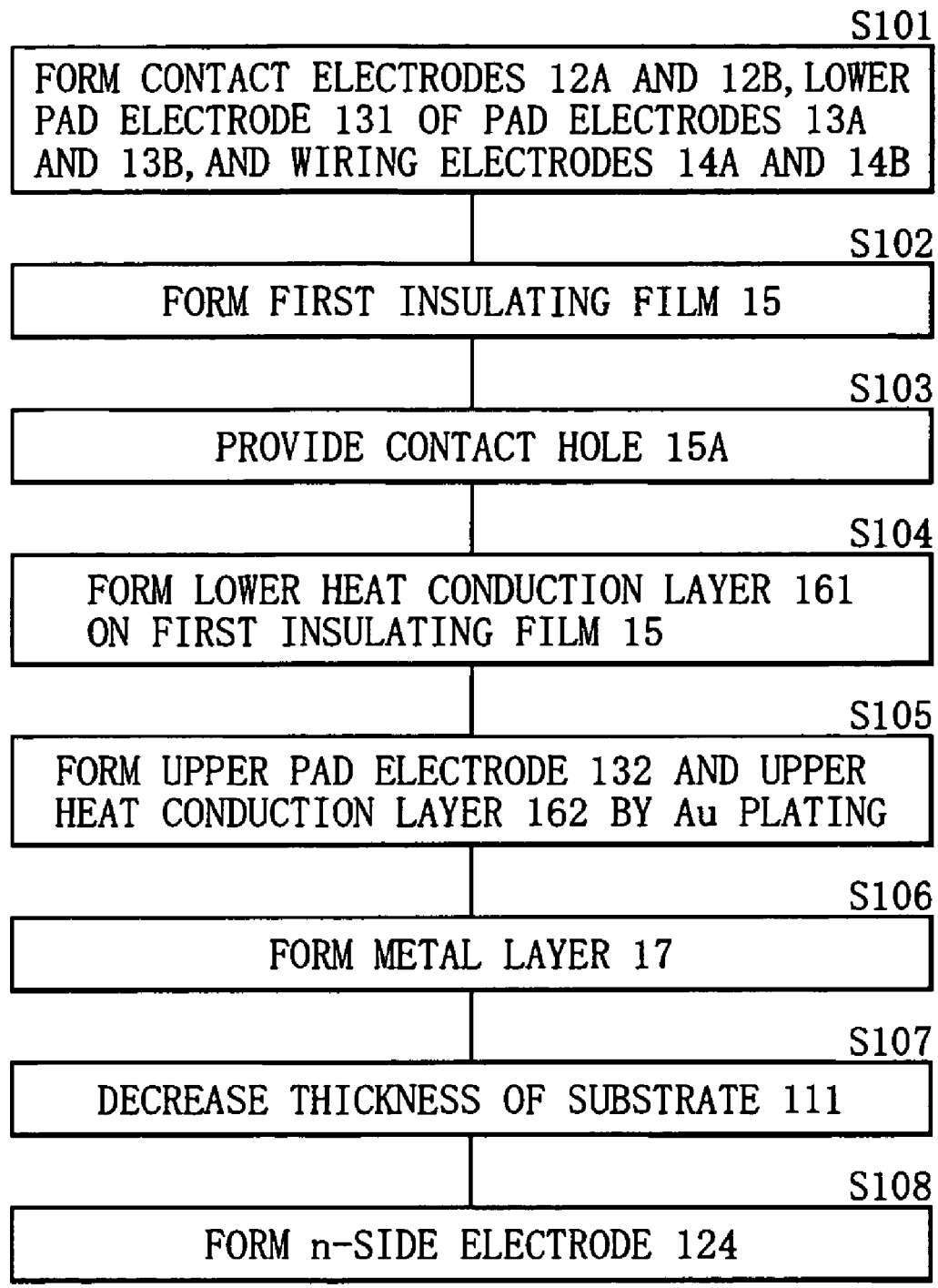
FIG. 6 is a chart illustrating a flow of a method of manufacturing the multibeam laser diode illustrated in FIG. 2 to FIG. 4.

FIG. 6 illustrates a flow of a method of manufacturing the multibeam laser diode illustrated in FIG. 2 to FIG. 5. FIG. 7 to FIG. 13 illustrate the method of manufacturing the multibeam laser diode in order of steps. First, for example, the substrate 111 configured of GaN is prepared. On the surface of the substrate 111, for example, by MOCVD (Metal Organic Chemical Vapor Deposition) method, the n-type cladding layer 112, the first guiding layer 113, the active layer 114, the second guiding layer 115, the first p-type cladding layer 116, the etching stop layer 117, the second p-type cladding layer 118, and the p-side contact layer 119 that have the foregoing thickness and are configured of the foregoing material are sequentially grown.

Figure 7:
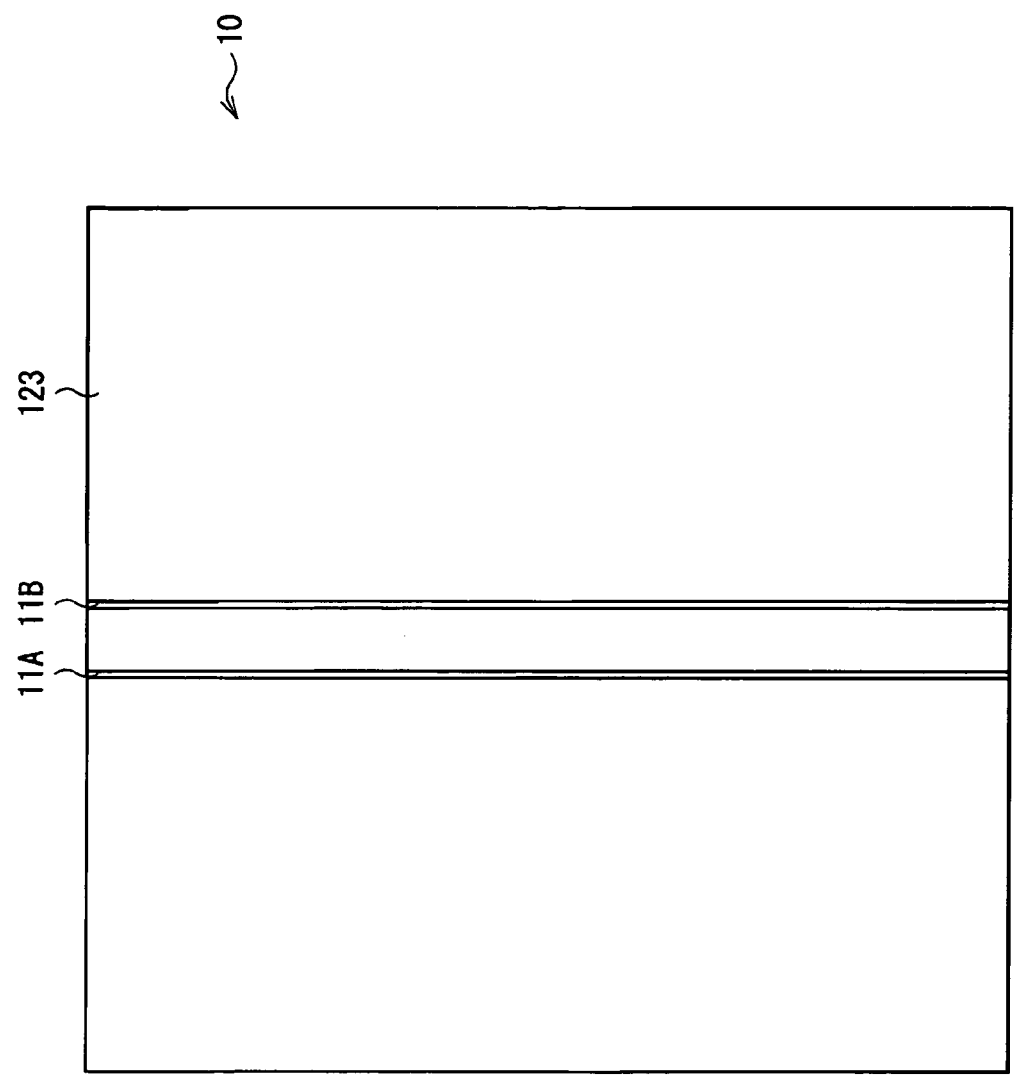
FIG. 7 is a plan view illustrating the method of manufacturing the multibeam laser diode illustrated in FIG. 6 in order of steps.

Next, etching with the use of the etching stop layer 117 is performed, and part of the p-side contact layer 119 and the second p-type cladding layer 118 is selectively removed to obtain the narrow strip-shaped protruding streaks 11A and 11B as illustrated in FIG. 5 and FIG. 7. Subsequently, as illustrated in FIG. 5, on the both sides of the protruding streaks 11A and 11B, the insulating layer 123 configured of the foregoing material is formed by, for example, CVD (Chemical Vapor Deposition) method. In the insulating layer 123, an aperture corresponding to the protruding streaks 11A and 11B is provided.

Figure 8:
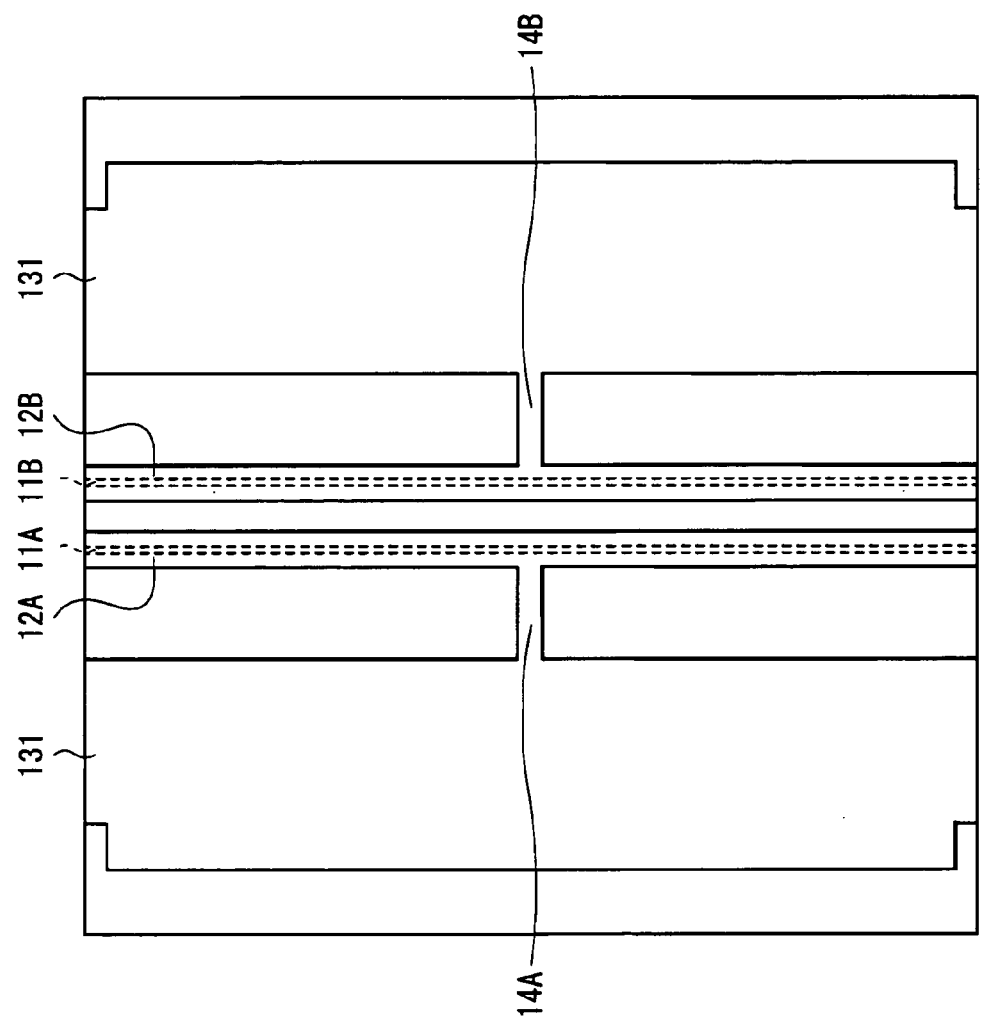
FIG. 8 is a plan view illustrating a step following the step illustrated in FIG. 7.

After that, as illustrated in FIG. 8, on the protruding streaks 11A and 11B, the contact electrodes 12A and 12B that have the foregoing thickness and are configured of the foregoing material are formed. In addition, the lower pad electrode 131 of the pad electrodes 13A and 13B is formed to avoid the protruding streaks 11A and 11B. The contact electrodes 12A and 12B and the lower pad electrode 131 of the pad electrodes 13A and 13B are connected by the wiring electrodes 14A and 14B (step S101).

Figure 9:
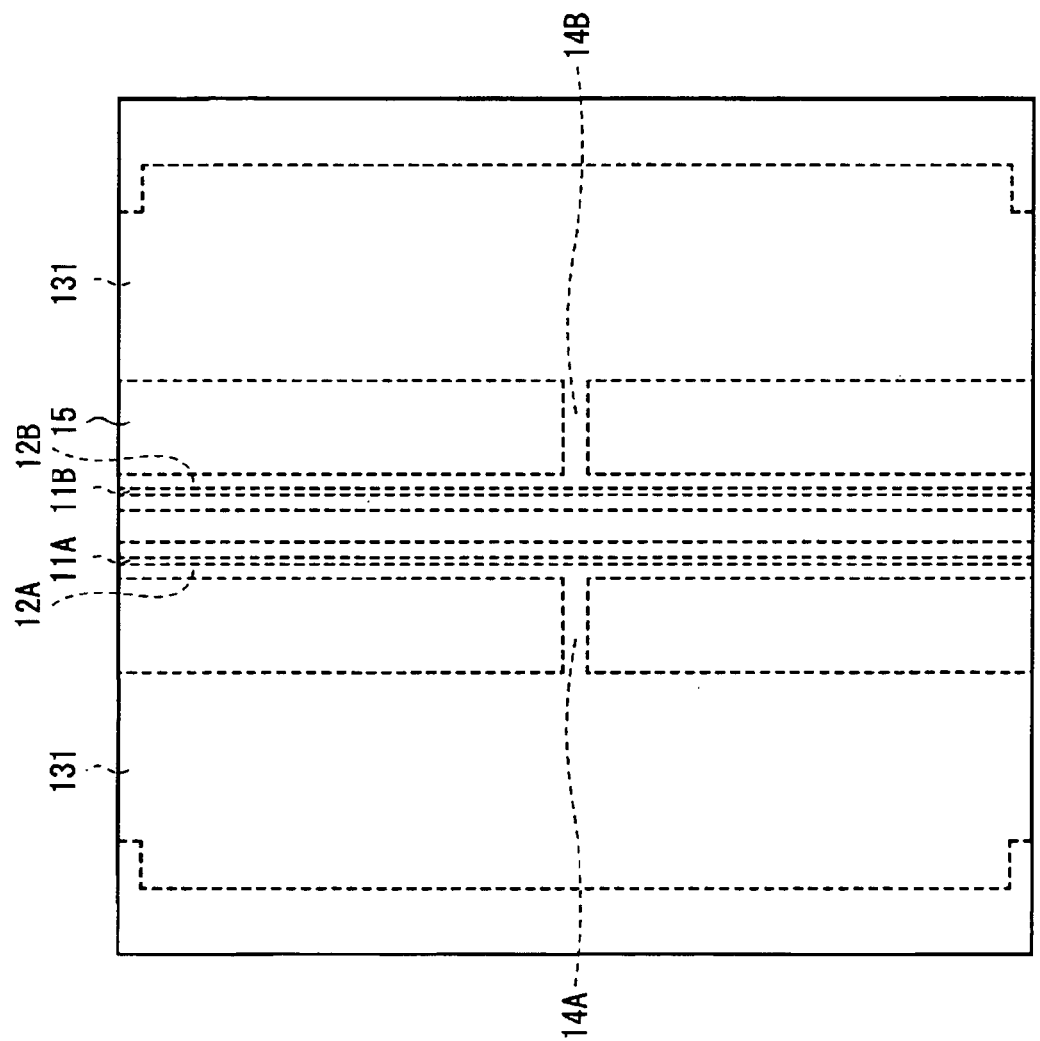
FIG. 9 is a plan view illustrating a step following the step illustrated in FIG. 8.

After the contact electrodes 12A and 12B, the pad electrodes 13A and 13B, and the wiring electrodes 14A and 14B are formed, as illustrated in FIG. 9, the first insulating film 15 that has the foregoing thickness and is configured of the foregoing material is formed on the whole area (step S102).

Figure 10:
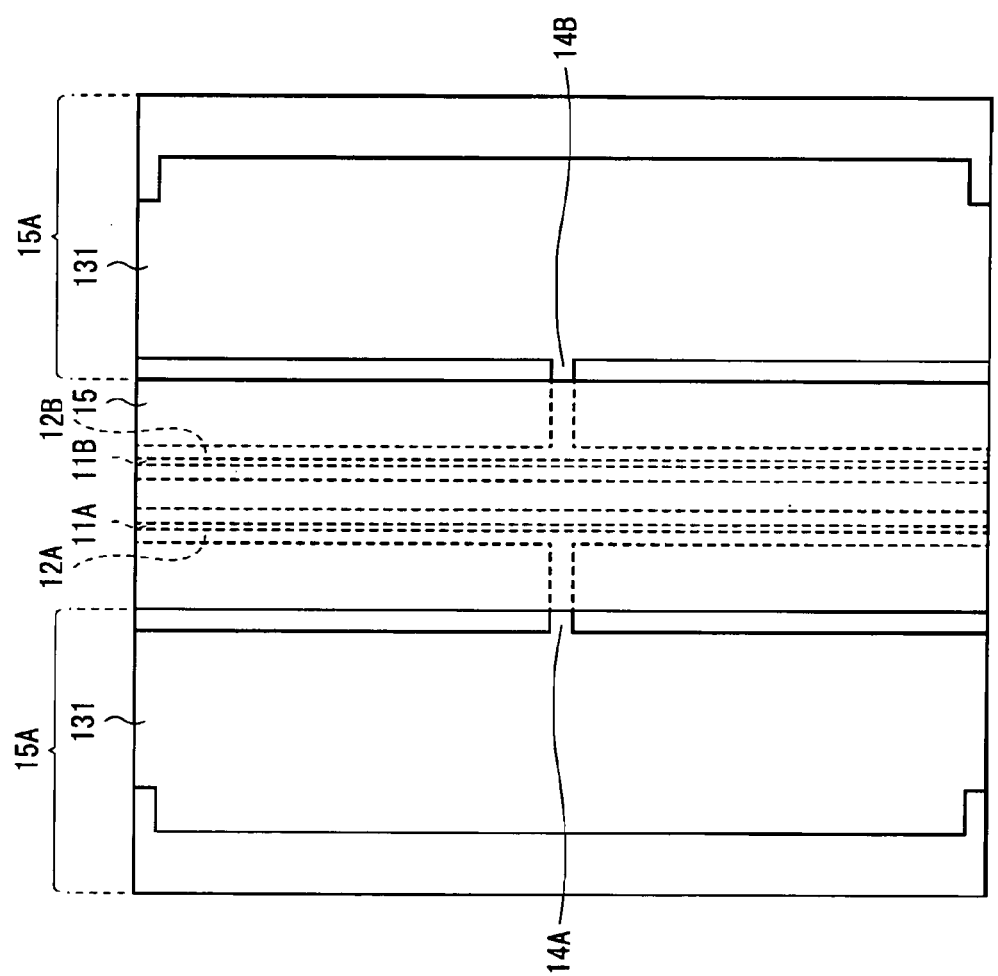
FIG. 10 is a plan view illustrating a step following the step illustrated in FIG. 9.

After the first insulating film 15 is formed, as illustrated in FIG. 10, the first insulating film 15 on the pad electrodes 13A and 13B is selectively removed to provide a contact hole 15A (step S103). Thereby, the first insulating film 15 is formed on the contact electrodes 12A and 12B.

Figure 11:
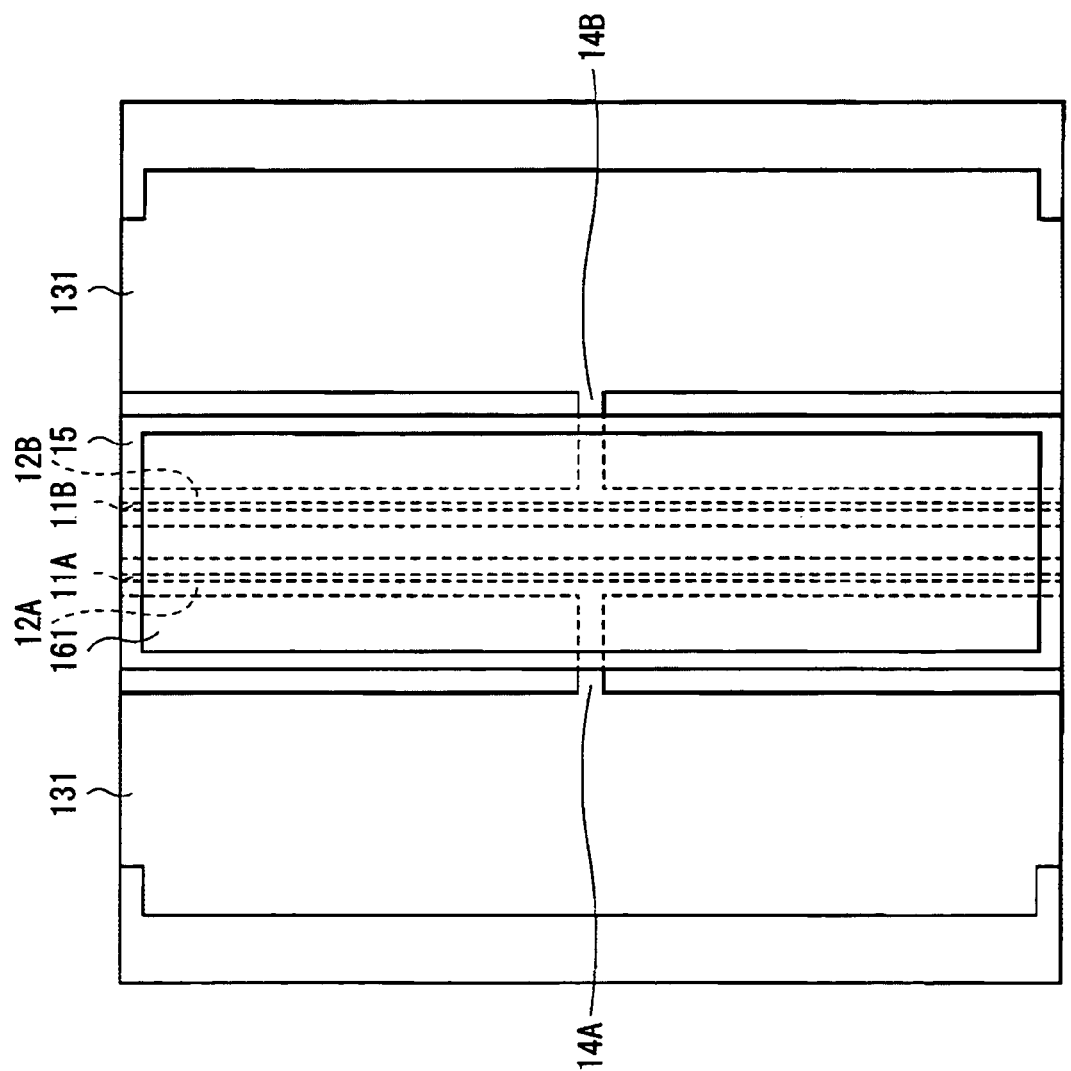
FIG. 11 is a plan view illustrating a step following the step illustrated in FIG. 10.

After the contact hole 15A is provided in the first insulating film 15, as illustrated in FIG. 11, the lower heat conduction layer 161 that has the foregoing thickness and is configured of the foregoing material is formed on the first insulating film 15 (step S104).

Figure 12:
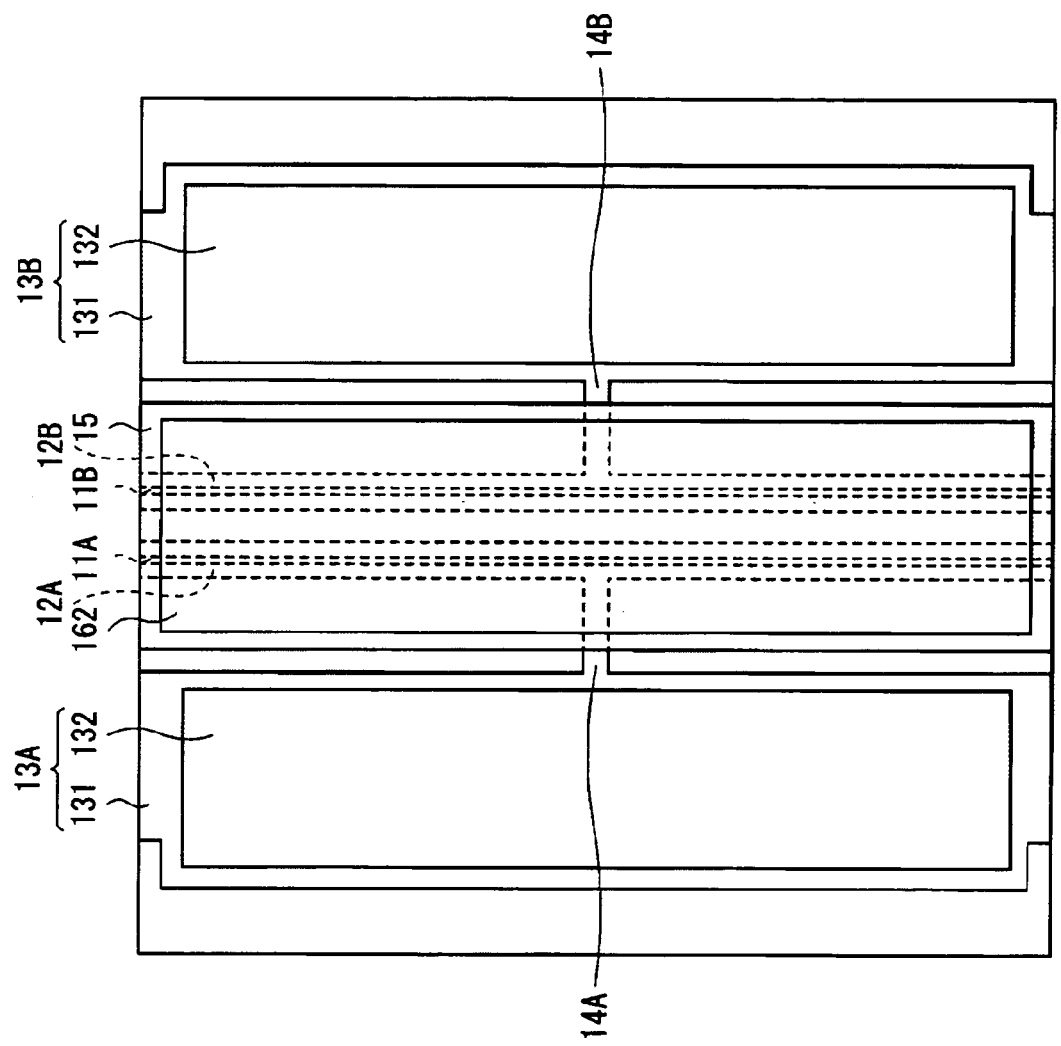
FIG. 12 is a plan view illustrating a step following the step illustrated in FIG. 11.

After the lower heat conduction layer 161 is formed, as illustrated in FIG. 12, the upper pad electrode 132 and the upper heat conduction layer 162 configured of the metal plated layer having the foregoing thickness are respectively formed on the lower pad electrode 131 of the pad electrodes 13A and 13B and the lower heat conduction layer 161 (step S105). Thereby, the pad electrodes 13A and 13B are formed to avoid the protruding streaks 11A and 11B, and the heat conduction layer 16 is formed on the first insulating film 15.

Figure 13:
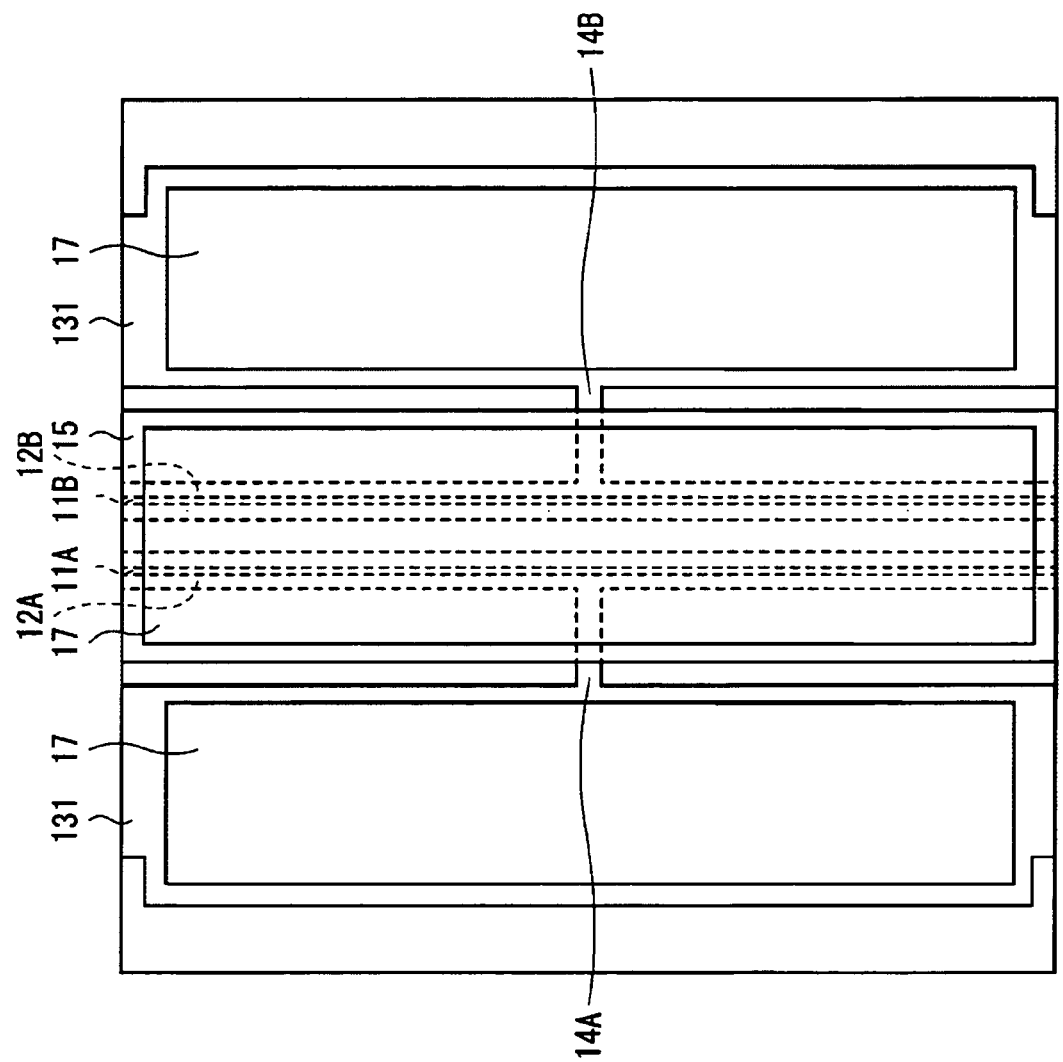
FIG. 13 is a plan view illustrating a step following the step illustrated in FIG. 12.

After the upper pad electrode 132 and the upper heat conduction layer 162 are formed, as illustrated in FIG. 13, the metal layer 17 that has the foregoing thickness and is configured of the foregoing material is formed on the upper pad electrode 132 and the upper heat conduction layer 162 (step S106).

After the metal layer 17 is formed, the rear face side of the substrate 111 is, for example, lapped and polished to decrease the thickness of the substrate 111 down to, for example, about 100 µm (step S107), and the n-side electrode 124 configured of the foregoing material is formed on the rear face of the substrate 111 (step S108). After that, the substrate 111 is adjusted to a given size, and the reflector films (not illustrated) are formed on the opposed pair of resonator end faces.

Subsequently, the support 20 configured of the foregoing material is prepared. As illustrated in FIG. 4, the solder layer 30 configured of the foregoing material is formed on one face of the support 20. After that, the laser diode device 10 is jointed to the support 20 by the solder layer 30 in a state of junction-down that the face on which the protruding streaks 11A and 11B of the laser diode device 10 are formed is opposed to the support 20. Accordingly, the multibeam laser diode illustrated in FIG. 1 is completed.

In the multibeam laser diode, in the case where a given voltage is applied to between the n-side electrode 124 and the contact electrodes 12A and 12B, a current is injected into the active layer 114, and light is emitted by electron-hole recombination. The light is reflected by the pair of reflector films, shuttles between the pair of reflector films, generates laser oscillation, and is radiated outside as a laser beam. In this embodiment, the contact electrodes 12A and 12B are connected to the pad electrodes 13A and 13B by the wiring electrodes 14A and 14B, and are covered with the first insulating film 15. Thus, the contact electrodes 12A and 12B are not straightly jointed to the solder layer 30, and are driven through the pad electrodes 13A and 13B and the wiring electrodes 14A and 14B. Further, the heat conduction layer 16 configured of a metal is provided on the first insulating film 15. Therefore, heat generated in the laser diode device 10 is released to the solder layer 30 and the support 20 through the heat conduction layer 16.

Further, by providing the first insulating film 15 on the contact electrodes 12A and 12B, stress applied to the protruding streaks 11A and 11B that is generated by providing the contact electrodes 12A and 12B and joint stress between the heat conduction layer 16 and the solder layer 30 applied to the protruding streaks 11A and 11B are decreased. Therefore, effect on polarization characteristics and reliability is decreased.

In particular, the contact electrodes 12A and 12B have a symmetrical width with respect to the protruding streaks 11A and 11B. Therefore, by providing the contact electrodes 12A and 12B, stress applied to the protruding streaks 11A and 11B is further decreased.

As described above, in this embodiment, the contact electrodes 12A and 12B are connected to the pad electrodes 13A and 13B by the wiring electrodes 14A and 14B, and are covered with the first insulating film 15. Thus, electric connection is enabled without straightly jointing the contact electrodes 12A and 12B to the solder layer 30. Further, the heat conduction layer 16 configured of a metal is provided on the first insulating film 15. Therefore, by jointing the heat conduction layer 16 to the solder layer 30, in the case of junction-down assembly, the heat release characteristics are able to be improved.

Further, by providing the first insulating film 15 on the contact electrodes 12A and 12B, stress applied to the protruding streaks 11A and 11B that is generated by providing the contact electrodes 12A and 12B and joint stress between the heat conduction layer 16 and the solder layer 30 applied to the protruding streaks 11A and 11B are able to be decreased. Therefore, effect on polarization characteristics and reliability is able to be decreased.

2. Second Embodiment

Structure of Multibeam Laser Diode

Figure 14:
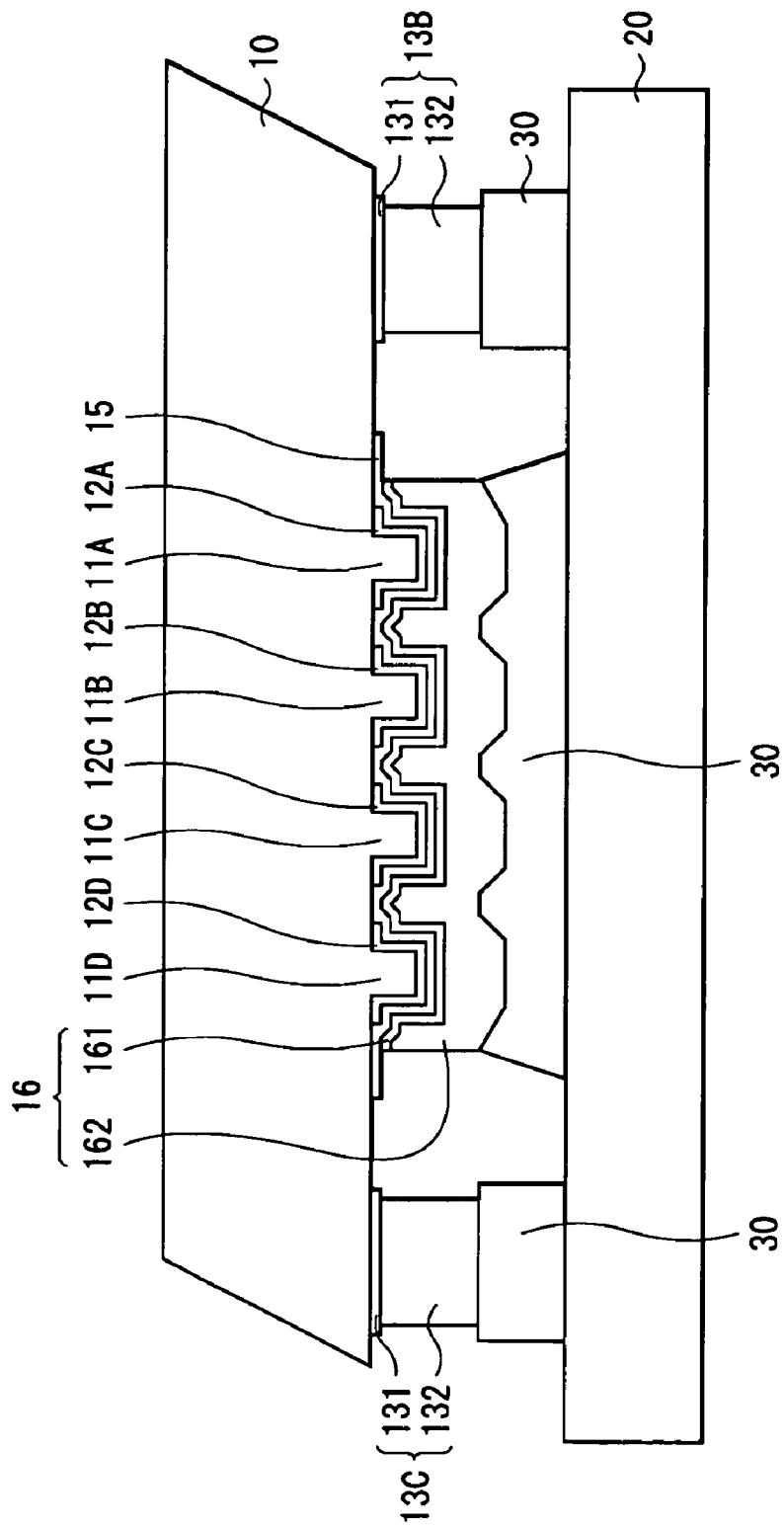
FIG. 14 is a cross sectional view illustrating a structure of a multibeam laser diode according to a second embodiment of the invention.

FIG. 14 illustrates a longitudinal cross sectional structure of a multibeam laser diode according to a second embodiment of the invention. The multibeam laser diode is different from that of the first embodiment in the structure that four protruding streaks 11A, 11B, 11C, and 11D are formed in the laser diode device 10. Thus, a description will be given by using the same referential symbols for corresponding elements.

Figure 15:
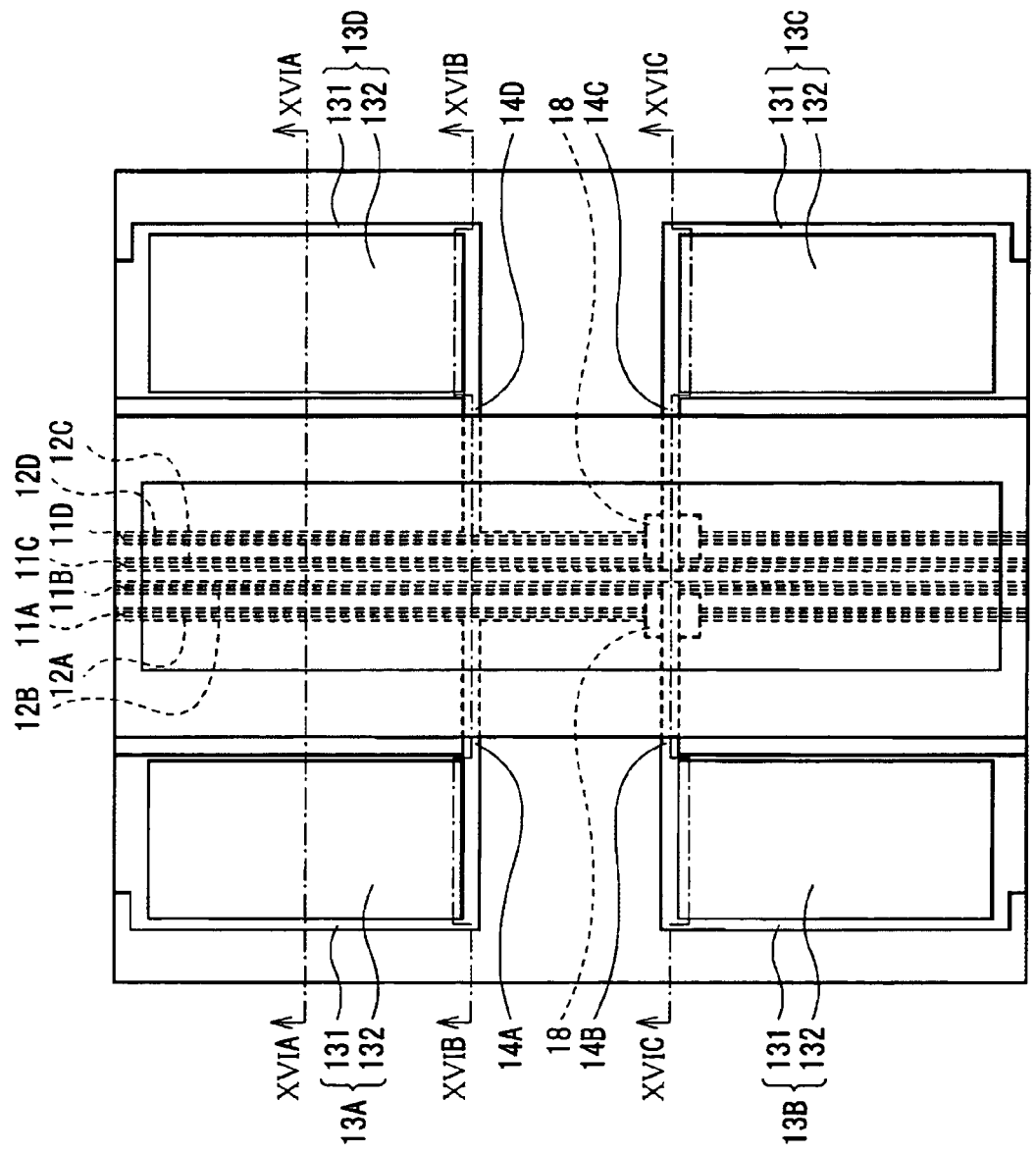
FIG. 15 is a plan view illustrating a structure viewed from the side of the face, on which protruding streaks are formed, of the multibeam laser diode illustrated in FIG. 14.

FIG. 15 illustrates a planar structure viewed from the side of the face, on which the protruding streaks 11A to 11D are formed, of the multibeam laser diode illustrated in FIG. 14. FIG. 16A illustrates a cross sectional structure taken along line XVIA-XVIA of FIG. 15, FIG. 16B illustrates a cross sectional structure taken along line XVIB-XVIB of FIG. 15, and FIG. 16C illustrates a cross sectional structure taken along line XVIC-XVIC of FIG. 15.

The laser diode device 10 and the protruding streaks 11A to 11D are structured in the same manner as that of the first embodiment.

Four contact electrodes 12A, 12B, 12C, and 12D and four pad electrodes 13A, 13B, 13C, and 13D are provided on the face on which the protruding streaks 11A to 11D of the laser diode device 10 are formed. Contact electrodes 12A to 12D and pad electrodes 13A to 13D are respectively connected by wiring electrodes 14A, 14B, 14C, and 14D.

The contact electrodes 12A to 12D preferably have a symmetrical width with respect to the protruding streaks 11A to 11D as in the first embodiment. By providing the contact electrodes 12A to 12D, stress applied to the protruding streaks 11A to 11D is able to be decreased.

The wiring electrode 14B connects the contact electrode 12B to the pad electrode 13B, skipping over the contact electrode 12A. The wiring electrode 14B is insulated from the contact electrode 12A by a second insulating film 18. The wiring electrode 14C connects the contact electrode 12C to the pad electrode 13C, skipping over the contact electrode 12D. The wiring electrode 14C is insulated from the contact electrode 12D by the second insulating film 18. Thereby, in this embodiment, even if the four protruding streaks 11A to 11D are formed in the laser diode device 10, the contact electrodes 12A to 12D are able to be connected to the pad electrodes 13A to 13D by the wiring electrodes 14A to 14D without straightly jointing the contact electrodes 12A to 12D to the solder layer 30.

The first insulating film 15, the heat conduction layer 16, and the metal layer 17 are structured in the same manner as that in the first embodiment.

The second insulating film 18 is preferably, for example, about 100 nm thick. As the second insulating film 18 is thinner, the heat release characteristic are able to be improved more. Further, the second insulating film 18 is preferably configured of, for example, one or more selected from the group consisting of AlN, SiC, diamond, BN, $SiO_2$, and SiN.

Figure 17:
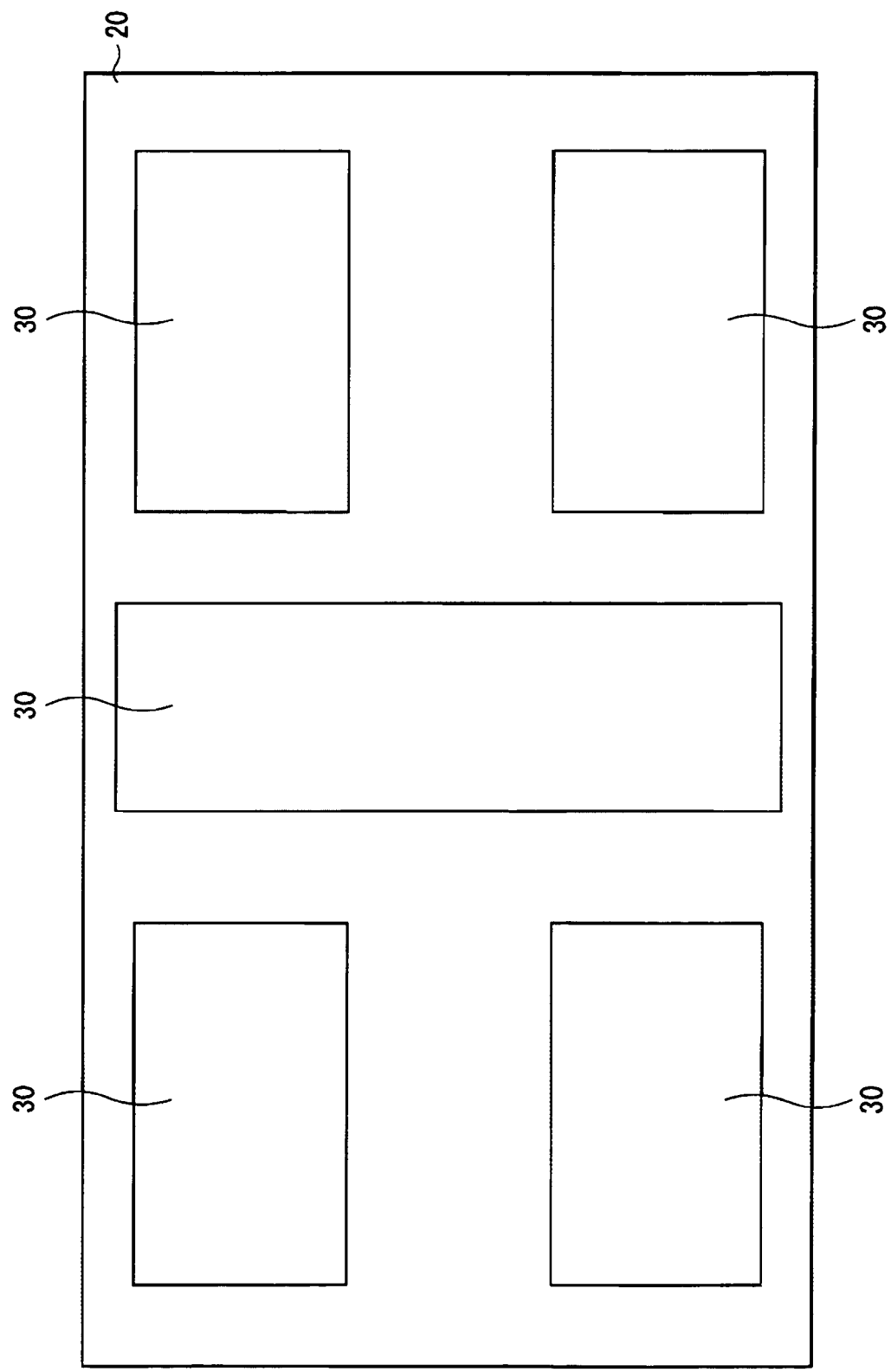
FIG. 17 is a plan view illustrating a structure viewed from the side of the face, on which a solder layer is formed, of the support illustrated in FIG. 14.

FIG. 17 illustrates a structure viewed from the side of the face on which the solder layer 30 is formed of the support 20. The solder layer 30 is provided between the support 20 and the pad electrodes 13A to 13D and between the support 20 and the heat conduction layer 16.

Method of Manufacturing Multibeam Laser Diode

The multibeam laser diode is able to be manufactured by, for example, as follows.

Figure 18:
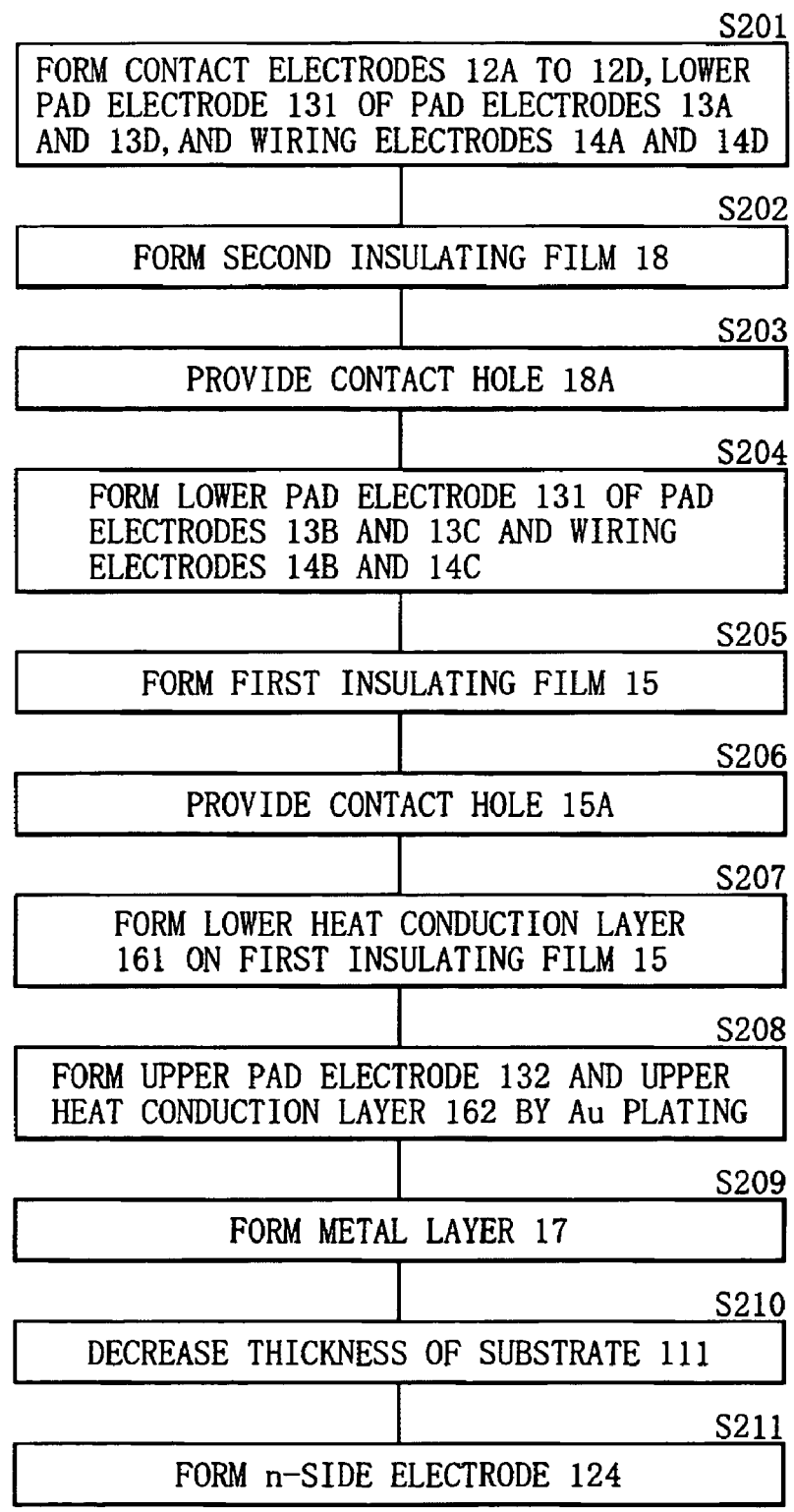
FIG. 18 is a chart illustrating a flow of a method of manufacturing the multibeam laser diode illustrated in FIG. 15 to FIG. 17.
Figure 19:
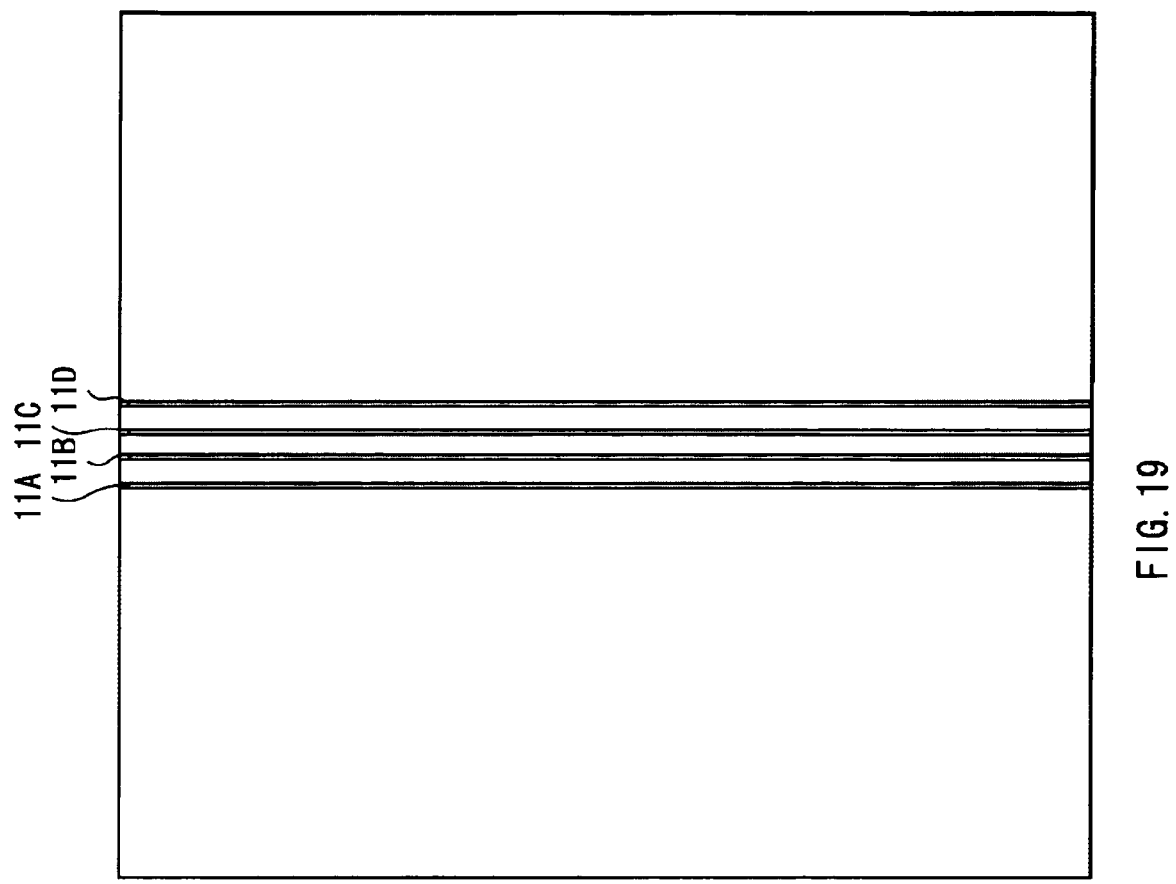
FIG. 19 is a plan view illustrating the method of manufacturing the multibeam laser diode illustrated in FIG. 18 in order of steps.

FIG. 18 illustrates a flow of a method of manufacturing the multibeam laser diode illustrated in FIG. 15 to FIG. 17. FIG. 19 to FIG. 28 illustrate the method of manufacturing the multibeam laser diode in order of steps. First, as illustrated in FIG. 19, the laser diode device 10 having the four protruding streaks 11A to 11D is formed by the steps illustrated in FIG. 5 and FIG. 7 in the same manner as that in the first embodiment.

Figure 20:
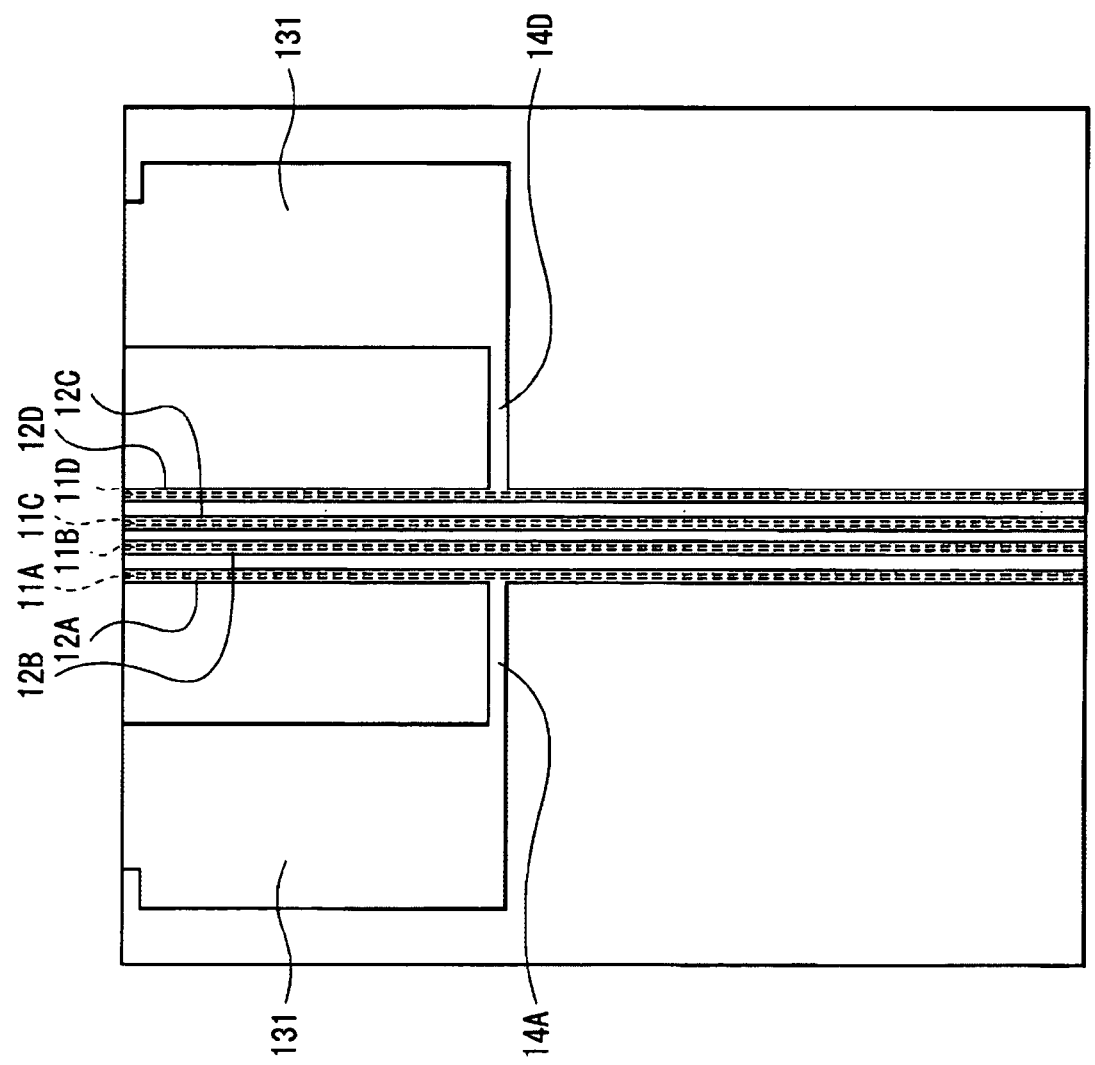
FIG. 20 is a plan view illustrating a step following the step illustrated in FIG. 19.

Next, as illustrated in FIG. 20, on the protruding streaks 11A to 11D, the contact electrodes 12A to 12D that have the foregoing thickness and are configured of the foregoing material are formed. In addition, the lower pad electrode 131 of the pad electrodes 13A and 13D is formed to avoid the protruding streaks 11A to 11D. The contact electrodes 12A and 12D and the lower pad electrode 131 of the pad electrodes 13A and 13B are connected by the wiring electrodes 14A and 14D (step S201).

Figure 21:
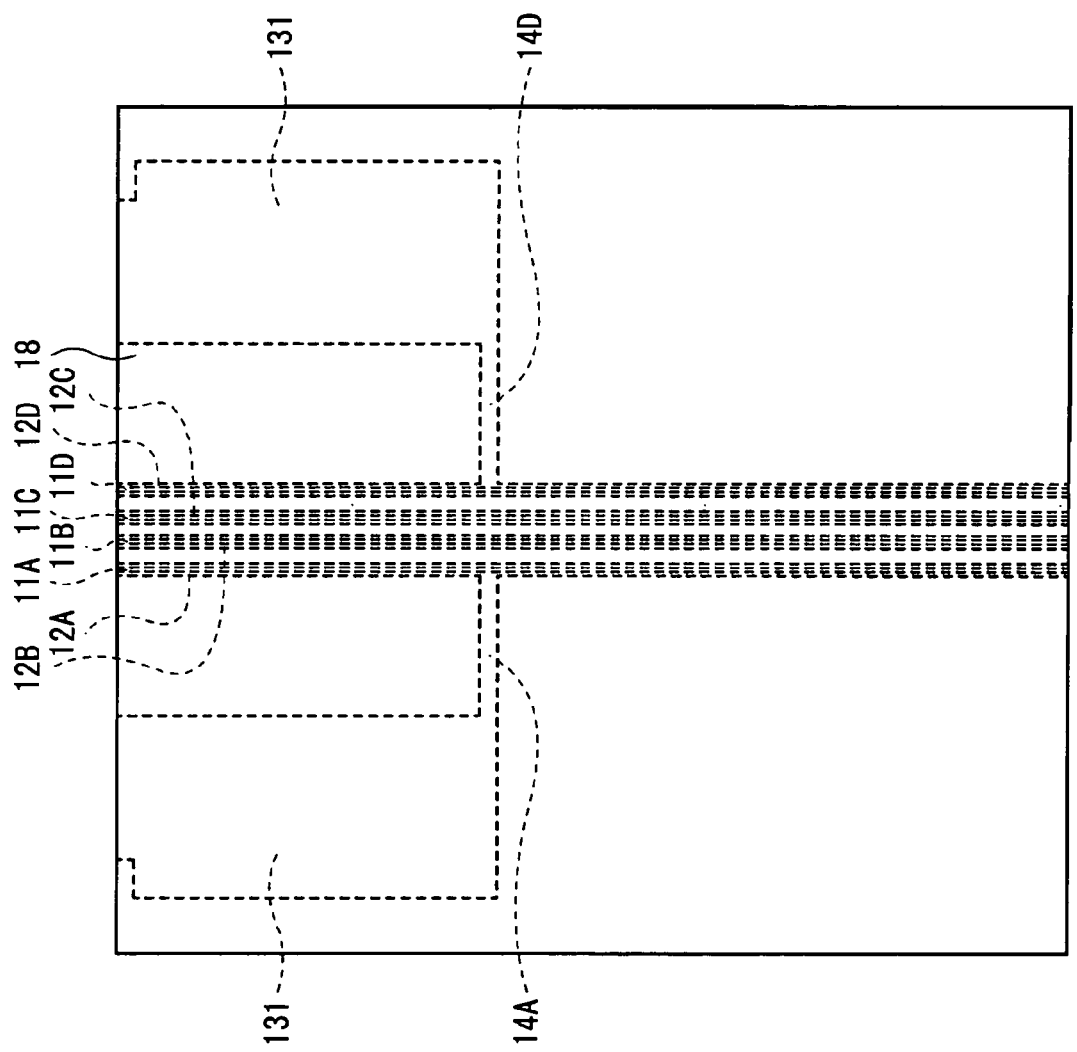
FIG. 21 is a plan view illustrating a step following the step illustrated in FIG. 20.

Subsequently, as illustrated in FIG. 21, the second insulating film 18 that has the foregoing thickness and is configured of the foregoing material is formed on the whole area (step S202).

Figure 22:
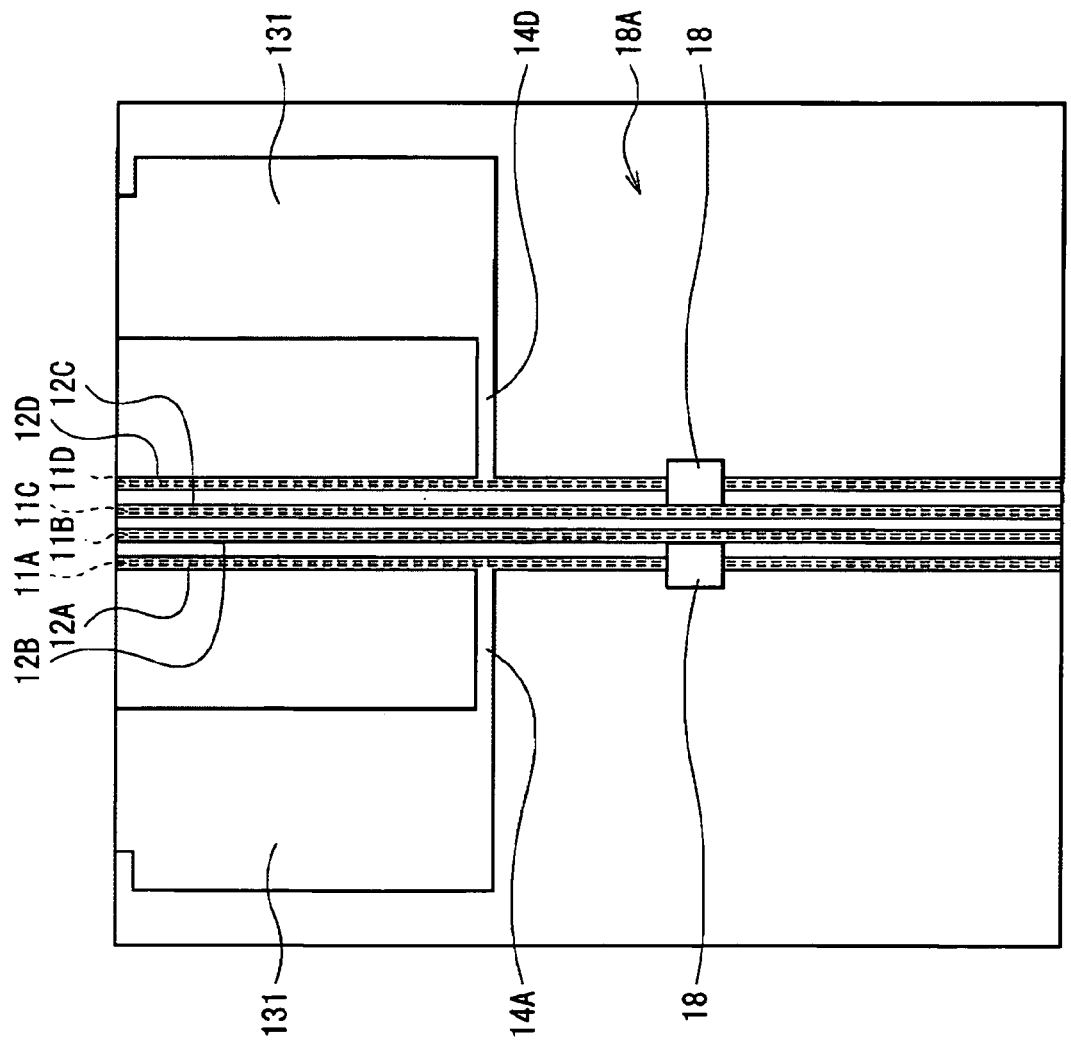
FIG. 22 is a plan view illustrating a step following the step illustrated in FIG. 21.

After that, as illustrated in FIG. 22, the second insulating film 18 is selectively removed to provide a contact hole 18A (step S203). Thereby, the second insulating film 18 is formed in a position where the wiring electrodes 14B and 14C are to be formed on the contact electrodes 12A and 12D.

Figure 23:
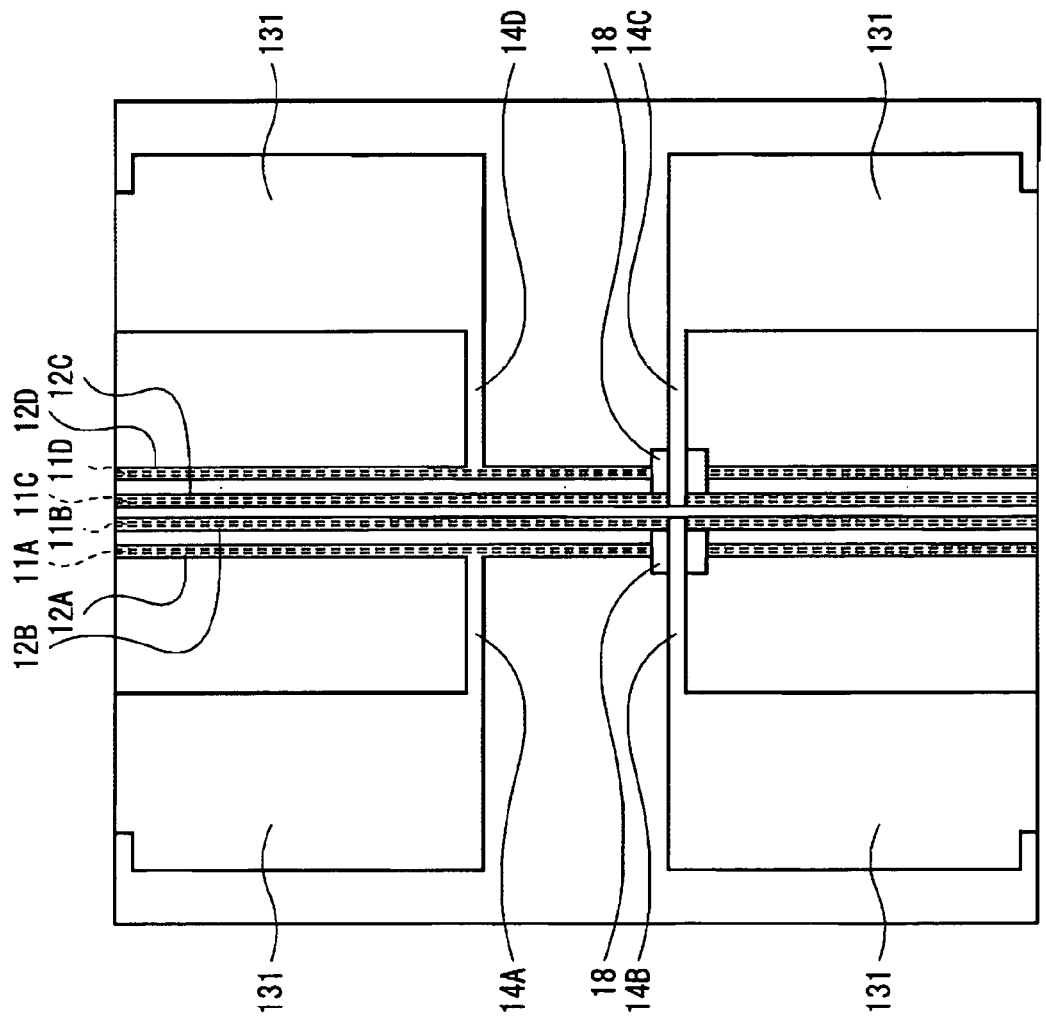
FIG. 23 is a plan view illustrating a step following the step illustrated in FIG. 22.

After the contact hole 18A is provided in the second insulating film 18, as illustrated in FIG. 23, the lower pad electrode 131 of the pad electrodes 13B and 13C is formed to avoid the protruding streaks 11A to 11D. The contact electrodes 12B and 12C and the lower pad electrode 131 of the pad electrodes 13B and 13C are connected by the wiring electrodes 14B and 14C (step S204). At this time, the wiring electrodes 14B and 14C are formed on the second insulating film 18, and thereby the wiring electrodes 14B and 14C are insulated from the contact electrodes 12A and 12D by the second insulating film 18.

Figure 24:
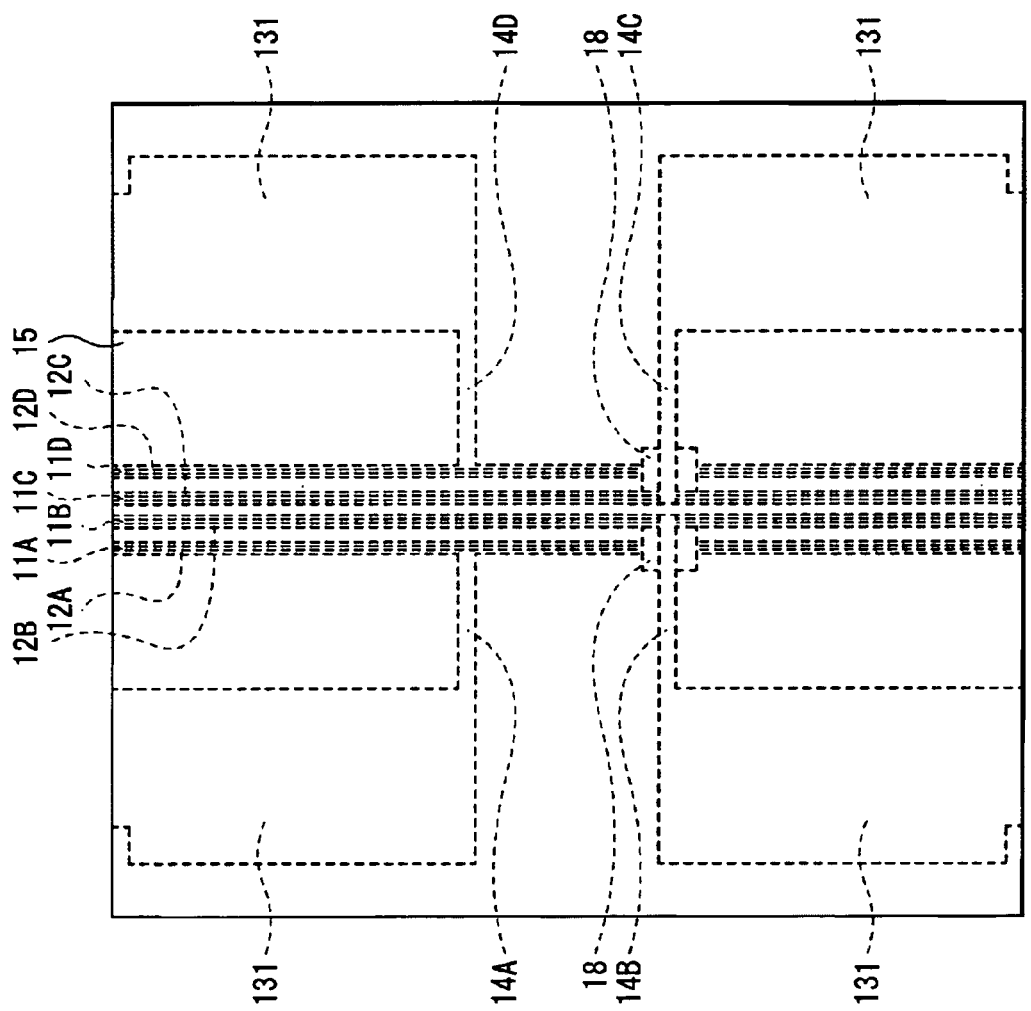
FIG. 24 is a plan view illustrating a step following the step illustrated in FIG. 23.

Subsequently, as illustrated in FIG. 24, the first insulating film 15 that has the foregoing thickness and is configured of the foregoing material is formed on the whole area (step S205).

Figure 25:
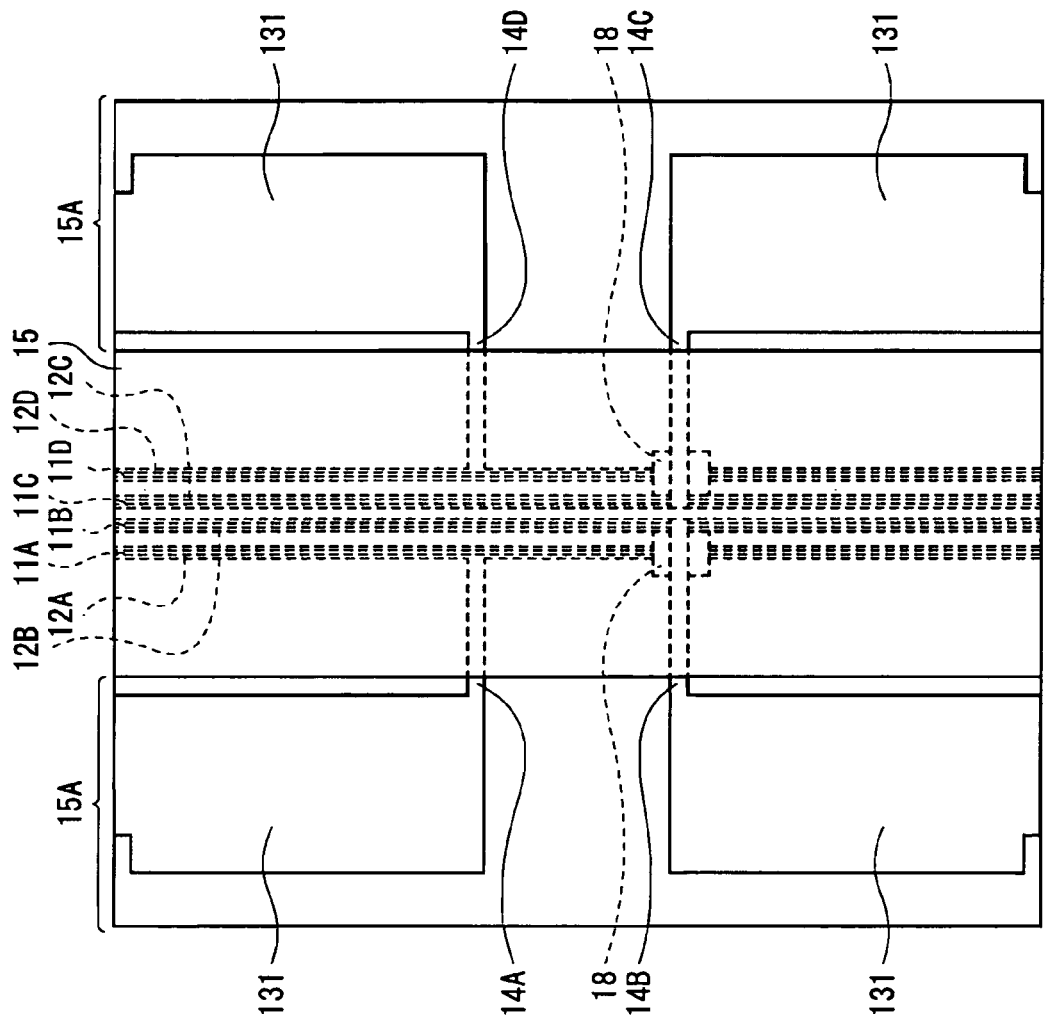
FIG. 25 is a plan view illustrating a step following the step illustrated in FIG. 24.

After that, as illustrated in FIG. 25, the first insulating film 15 on the pad electrodes 13A to 13D is selectively removed to provide the contact hole 15A (step S206). Thereby, the first insulating film 15 is formed on the contact electrodes 12A to 12D.

Figure 26:
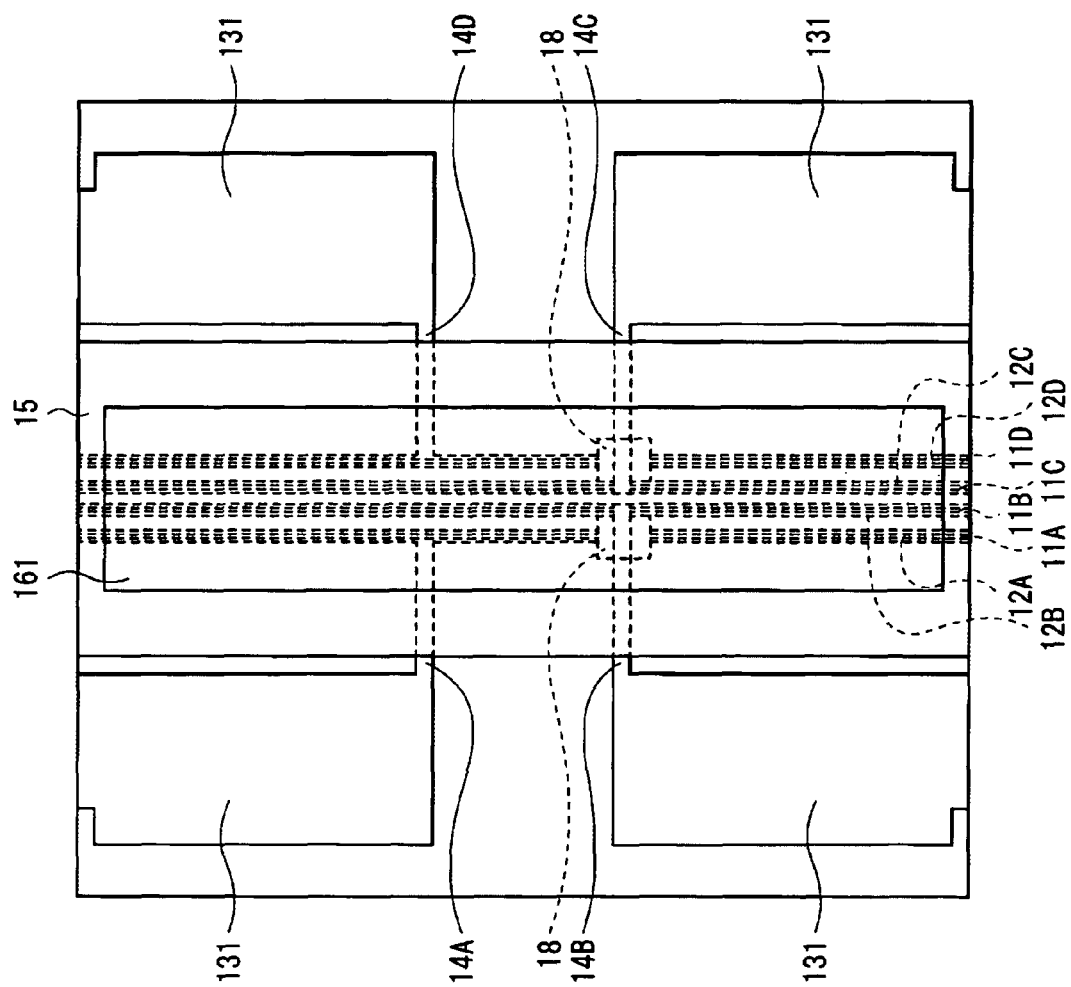
FIG. 26 is a plan view illustrating a step following the step illustrated in FIG. 25.

After the first insulating film 15 is formed, as illustrated in FIG. 26, the lower heat conduction layer 161 that has the foregoing thickness and is configured of the foregoing material is formed on the first insulating film 15 (step S207).

Figure 27:
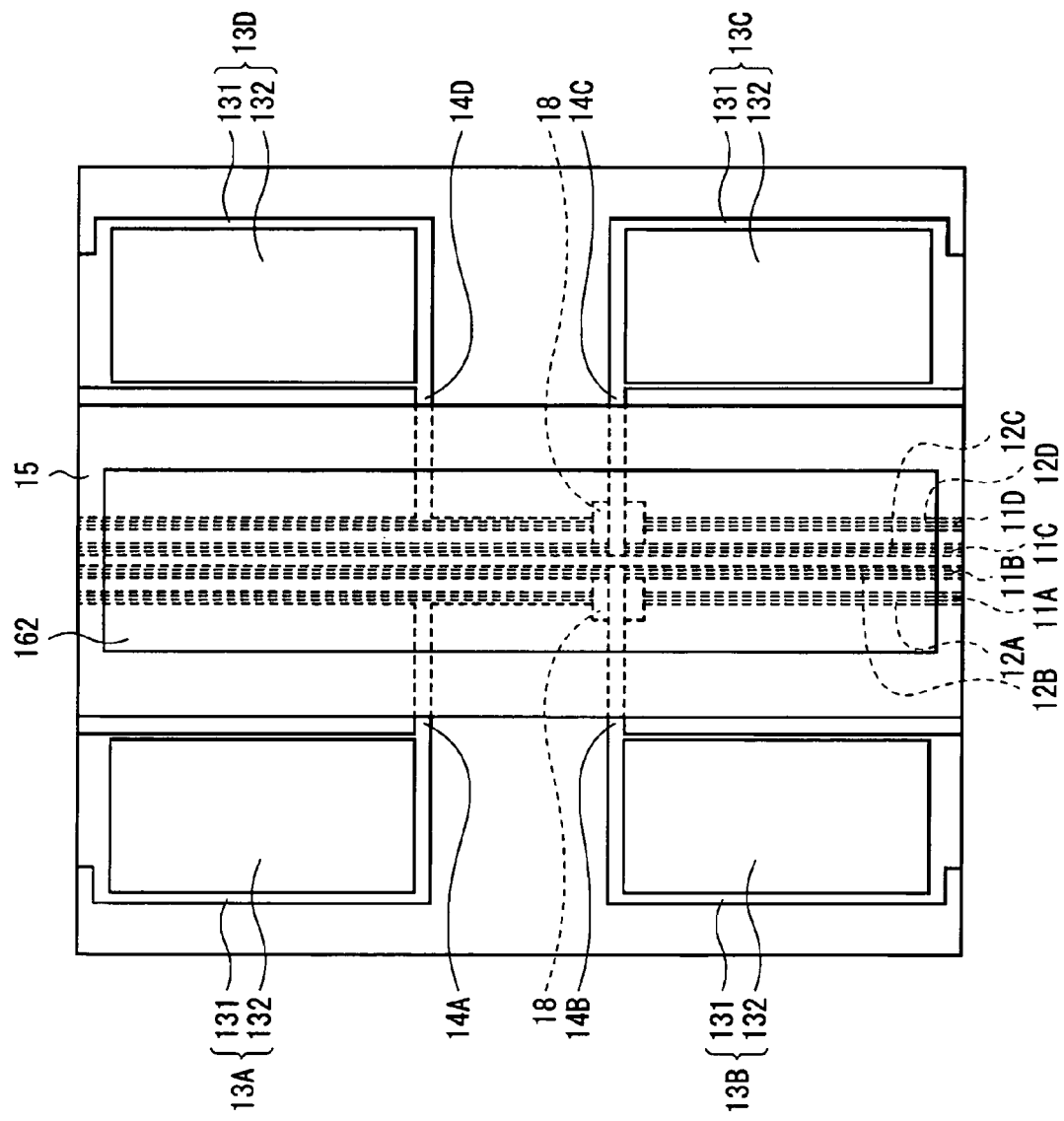
FIG. 27 is a plan view illustrating a step following the step illustrated in FIG. 26.

After the lower heat conduction layer 161 is formed, as illustrated in FIG. 27, the upper pad electrode 132 and the upper heat conduction layer 162 configured of the metal plated layer having the foregoing thickness are respectively formed on the lower pad electrode 131 of the pad electrodes 13A to 13D and the lower heat conduction layer 161 (step S208). Thereby, the pad electrodes 13A to 13D are formed to avoid the protruding streaks 11A to 11B, and the heat conduction layer 16 is formed on the first insulating film 15.

Figure 28:
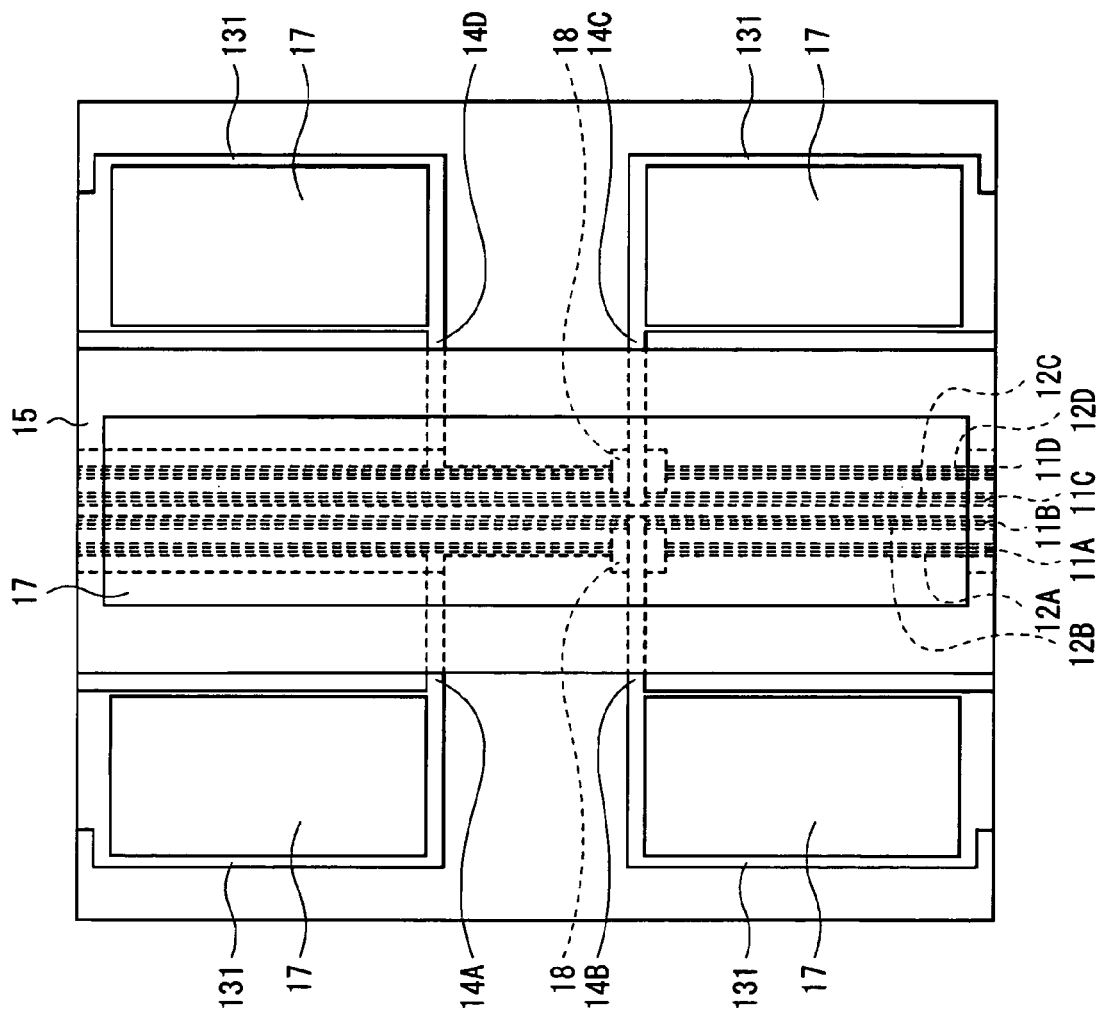
FIG. 28 is a plan view illustrating a step following the step illustrated in FIG. 27.

After the upper pad electrode 132 and the upper heat conduction layer 162 are formed, as illustrated in FIG. 28, the metal layer 17 that has the foregoing thickness and is configured of the foregoing material is formed on the upper pad electrode 132 and the upper heat conduction layer 162 (step S209).

After the metal layer 17 is formed, the rear face side of the substrate 111 is, for example, lapped and polished to decrease the thickness of the substrate 111 down to, for example, about 100 μm (step S210), and the n-side electrode 124 configured of the foregoing material is formed on the rear face of the substrate 111 (step S211). After that, the substrate 111 is adjusted to a given size, and the reflector films (not illustrated) are formed on the opposed pair of resonator end faces.

Subsequently, the support 20 configured of the foregoing material is prepared. As illustrated in FIG. 17, the solder layer 30 configured of the foregoing material is formed on one face of the support 20. After that, the laser diode device 10 is jointed to the support 20 by the solder layer 30 in a state of junction-down that the face on which the protruding streaks 11A and 11B of the laser diode device 10 are formed is opposed to the support 20. Accordingly, the multibeam laser diode illustrated in FIG. 14 is completed.

In the multibeam laser diode, in the case where a given voltage is applied to between the n-side electrode 124 and the contact electrodes 12A to 12D, laser oscillation is generated in the same manner as that of the first embodiment. In this embodiment, since the wiring electrodes 14B and 14C are insulated from the contact electrodes 12A and 12D by the second insulating film 18. Thus, even if the four protruding streaks 11A to 11D are formed in the laser diode device 10, the contact electrodes 12A to 12D are driven through the pad electrodes 13A to 13D and the wiring electrodes 14A to 14D without straightly jointing the contact electrodes 12A to 12D to the solder layer 30.

Further, the heat conduction layer 16 configured of a metal is provided on the first insulating film 15. Therefore, heat generated in the laser diode device 10 is released to the solder layer 30 and the support 20 through the heat conduction layer 16.

Further, by providing the first insulating film 15 on the contact electrodes 12A to 12D, stress applied to the protruding streaks 11A to 11D that is generated by providing the contact electrodes 12A to 12D and joint stress between the heat conduction layer 16 and the solder layer 30 applied to the protruding streaks 11A to 11D are decreased. Therefore, effect on polarization characteristics and reliability is decreased.

In particular, the contact electrodes 12A to 12D have a symmetrical width with respect to the protruding streaks 11A to 11D. Therefore, by providing the contact electrodes 12A to 12D, stress applied to the protruding streaks 11A to 11D is further decreased.

As described above, in this embodiment, the wiring electrodes 14B and 14C are insulated from the contact electrodes 12A and 12D by the second insulating film 18. Thus, even if the four protruding streaks 11A to 11D are formed in the laser diode device 10, electric connection is enabled without straightly jointing the contact electrodes 12A to 12D to the solder layer 30. Further, the heat conduction layer 16 configured of a metal is provided on the first insulating film 15. Therefore, by jointing the heat conduction layer 16 to the solder layer 30, in the case of junction-down assembly, the heat release characteristics are able to be improved.

Further, by providing the first insulating film 15 on the contact electrodes 12A and 12B, stress applied to the protruding streaks 11A and 11B that is generated by providing the contact electrodes 12A and 12B and joint stress between the heat conduction layer 16 and the solder layer 30 applied to the respective protruding streaks 11A and 11B are able to be decreased. Therefore, effect on polarization characteristics and reliability is able to be decreased.

3. Third Embodiment

Structure of Multibeam Laser Diode

Figure 29:
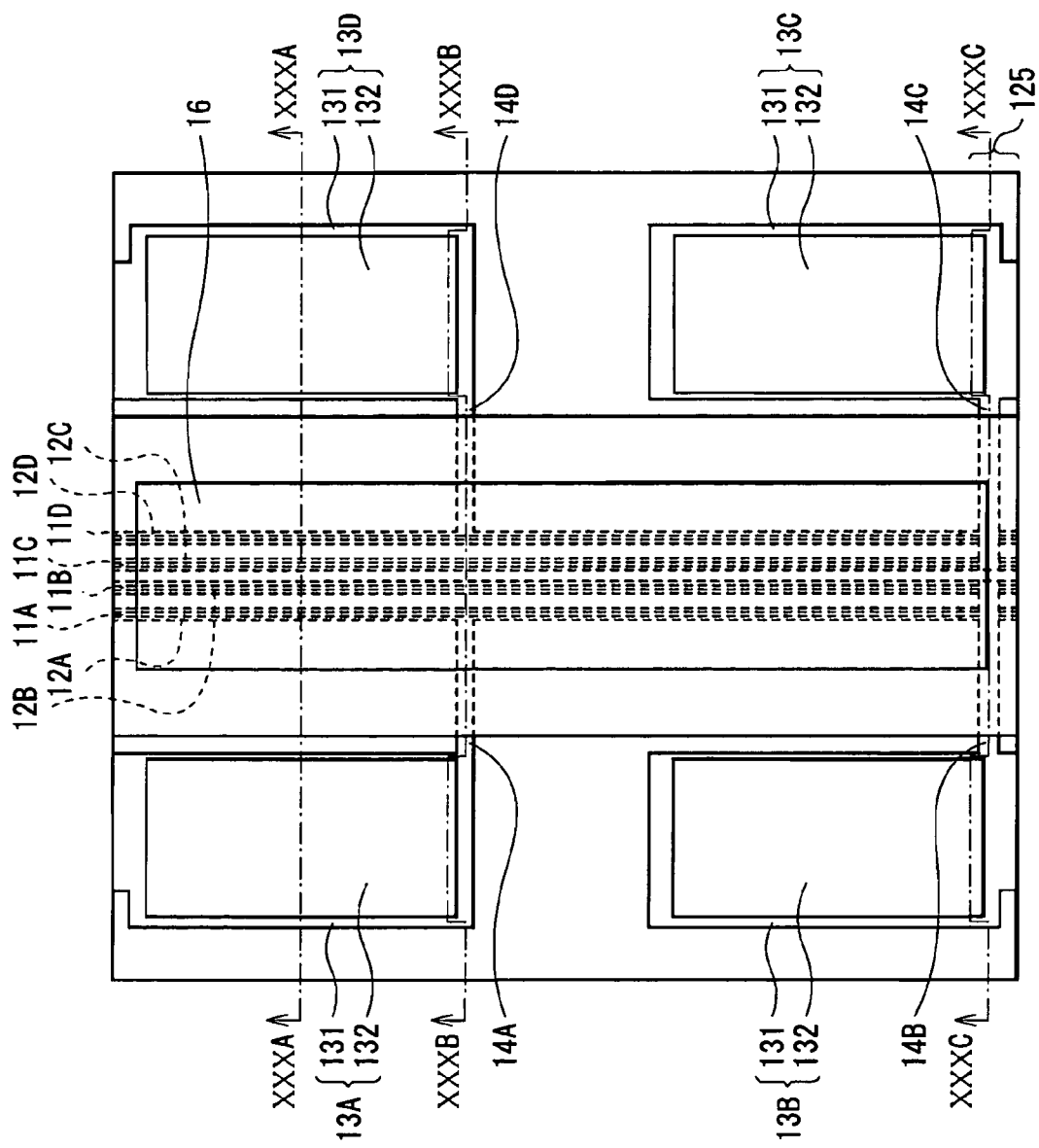
FIG. 29 is a plan view illustrating a structure viewed from the side of the face, on which protruding streaks are formed, of the multibeam laser diode according to a third embodiment of the invention.

FIG. 29 illustrates a planar structure viewed from the side of the face, on which the protruding streaks 11A to 11D are formed, of a multibeam laser diode according to a third embodiment of the invention. FIG. 30A illustrates a cross sectional structure taken along line XXXA-XXXA of FIG. 29, FIG. 30B illustrates a cross sectional structure taken along line XXXB-XXXB of FIG. 29, and FIG. 30C illustrates a cross sectional structure taken along line XXXC-XXXC of FIG. 29. The multibeam laser diode is different from that of the second embodiment in the structure that the wiring electrodes 14B and 14C are formed in a high-resistivity region 125 of the laser diode device 10. Thus, a description will be given by using the same referential symbols for corresponding elements.

The laser diode device 10 is structured in the same manner as that of the first embodiment, except that the high-resistivity region 125 provided with one or both of ion implantation and removing the p-side contact layer 119 is formed. The high-resistivity region 125 is preferably provided in, for example, a rear end face.

The protruding streaks 11A to 11D, the contact electrodes 12A to 12D, and the pad electrodes 13A to 13D are structured in the same manner as that of the first embodiment.

The contact electrodes 12A to 12D preferably have a symmetrical width with respect to the protruding streaks 11A to 11D as in the first embodiment. By providing the contact electrodes 12A to 12D, stress applied to the protruding streaks 11A to 11D is able to be decreased.

The wiring electrode 14B connects the contact electrode 12B to the pad electrode 13B, skipping over the contact electrode 12A. The wiring electrode 14C connects the contact electrode 12C to the pad electrode 13C, skipping over the contact electrode 12D. The wiring electrodes 14B and 14C are provided in the high-resistivity region 125 of the laser diode device 10. Thereby, in this embodiment, even if the four protruding streaks 11A to 11D are formed in the laser diode device 10, the contact electrodes 12A to 12D are able to be connected to the pad electrodes 13A to 13D by the wiring electrodes 14A to 14D without straightly jointing the contact electrodes 12A to 12D to the solder layer 30. Further, in this embodiment, the second insulating film 18 may be not necessitated and thus the manufacturing steps are able to be simplified.

The first insulating film 15, the heat conduction layer 16, and the metal layer 17 are structured in the same manner as that in the first embodiment. The support 20 and the solder layer 30 are structured in the same manner as that in the second embodiment.

Method of Manufacturing Multibeam Laser Diode

The multibeam laser diode is able to be manufactured by, for example, as follows.

Figure 31:
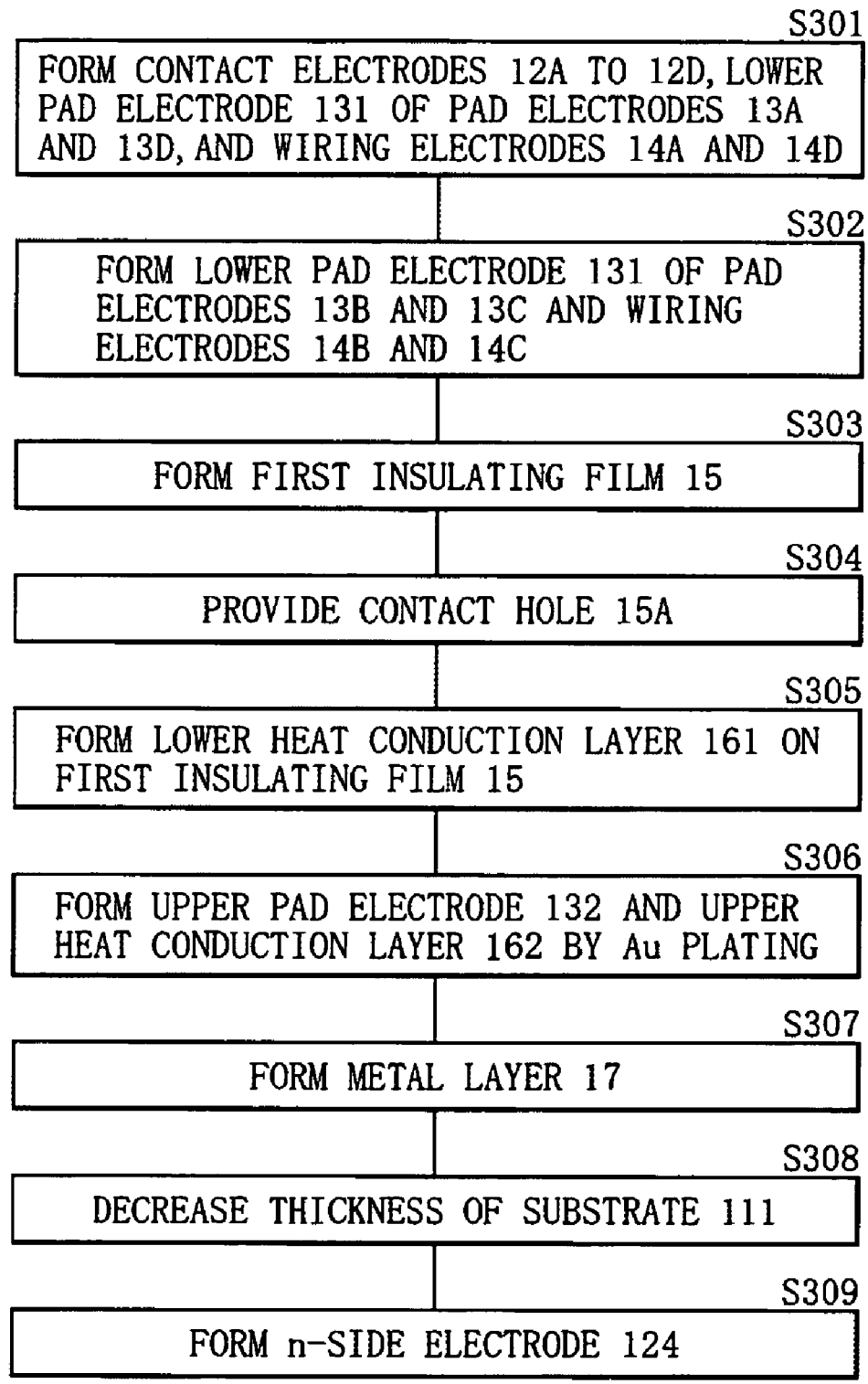
FIG. 31 is a chart illustrating a flow of a method of manufacturing the multibeam laser diode illustrated in FIG. 29 and FIG. 30.
Figure 32:
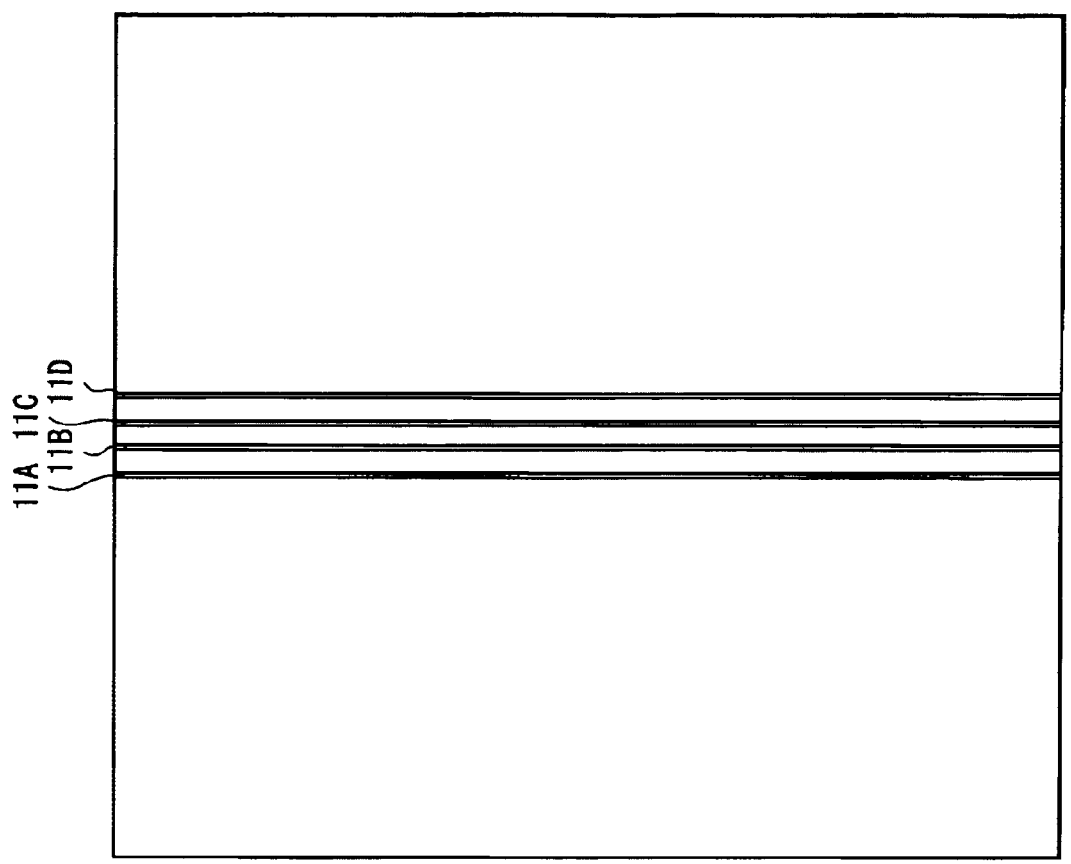
FIG. 32 is a plan view illustrating the method of manufacturing the multibeam laser diode illustrated in FIG. 31 in order of steps.

FIG. 31 illustrates a flow of a method of manufacturing the multibeam laser diode illustrated in FIG. 29 and FIG. 30. FIG. 32 to FIG. 39 illustrate the method of manufacturing the multibeam laser diode in order of steps. First, as illustrated in FIG. 32, the laser diode device 10 having the four protruding streaks 11A to 11D is formed by the steps illustrated in FIG. 5 and FIG. 7 in the same manner as that in the first embodiment. At this time, the high-resistivity region 125 is formed on the rear end face by providing one or both of ion implantation and removing the p-side contact layer 119.

Figure 33:
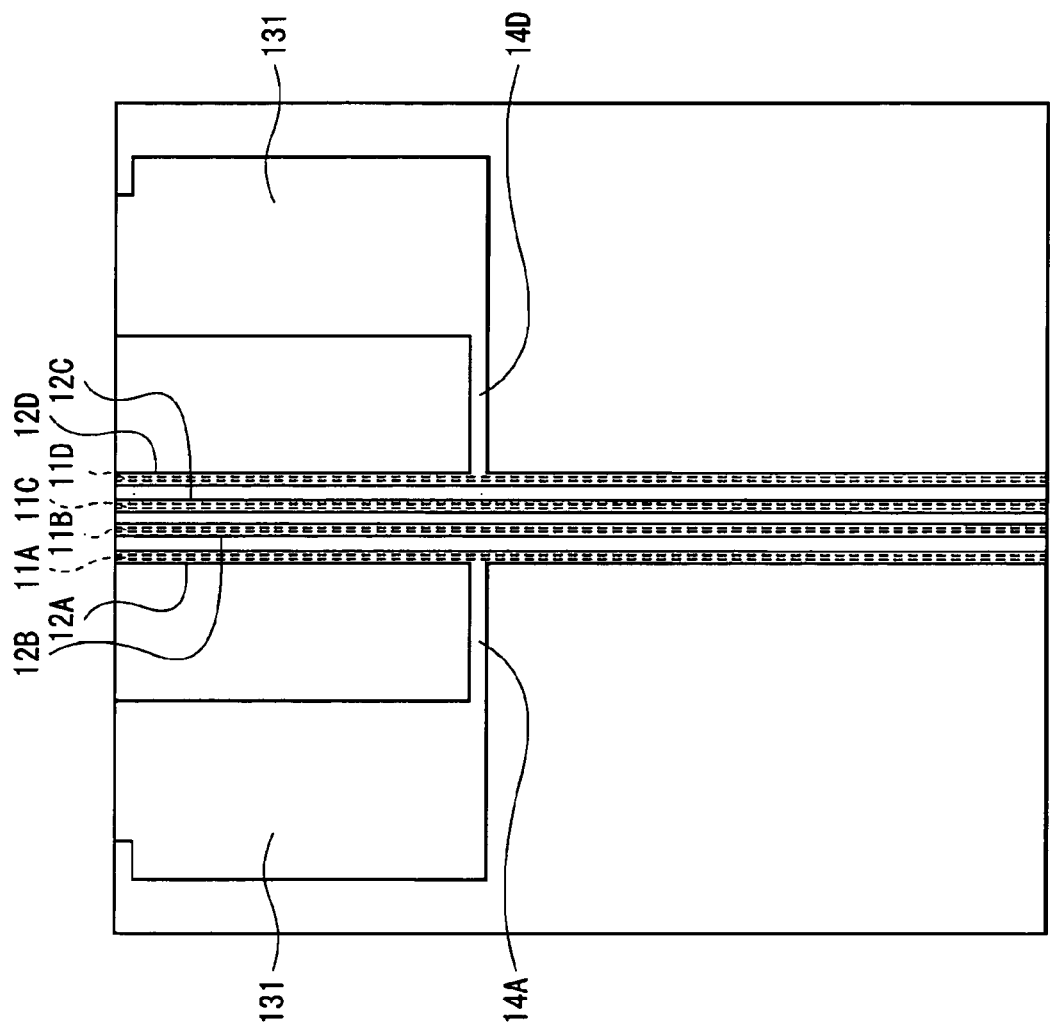
FIG. 33 is a plan view illustrating a step following the step illustrated in FIG. 32.

Next, as illustrated in FIG. 33, on the protruding streaks 11A to 11D, the contact electrodes 12A to 12D that have the foregoing thickness and are configured of the foregoing material are formed. In addition, the lower pad electrode 131 of the pad electrodes 13A and 13D is formed to avoid the protruding streaks 11A to 11D. The contact electrodes 12A and 12D and the lower pad electrode 131 of the pad electrodes 13A and 13D are connected by the wiring electrodes 14A and 14D (step S301).

Figure 34:
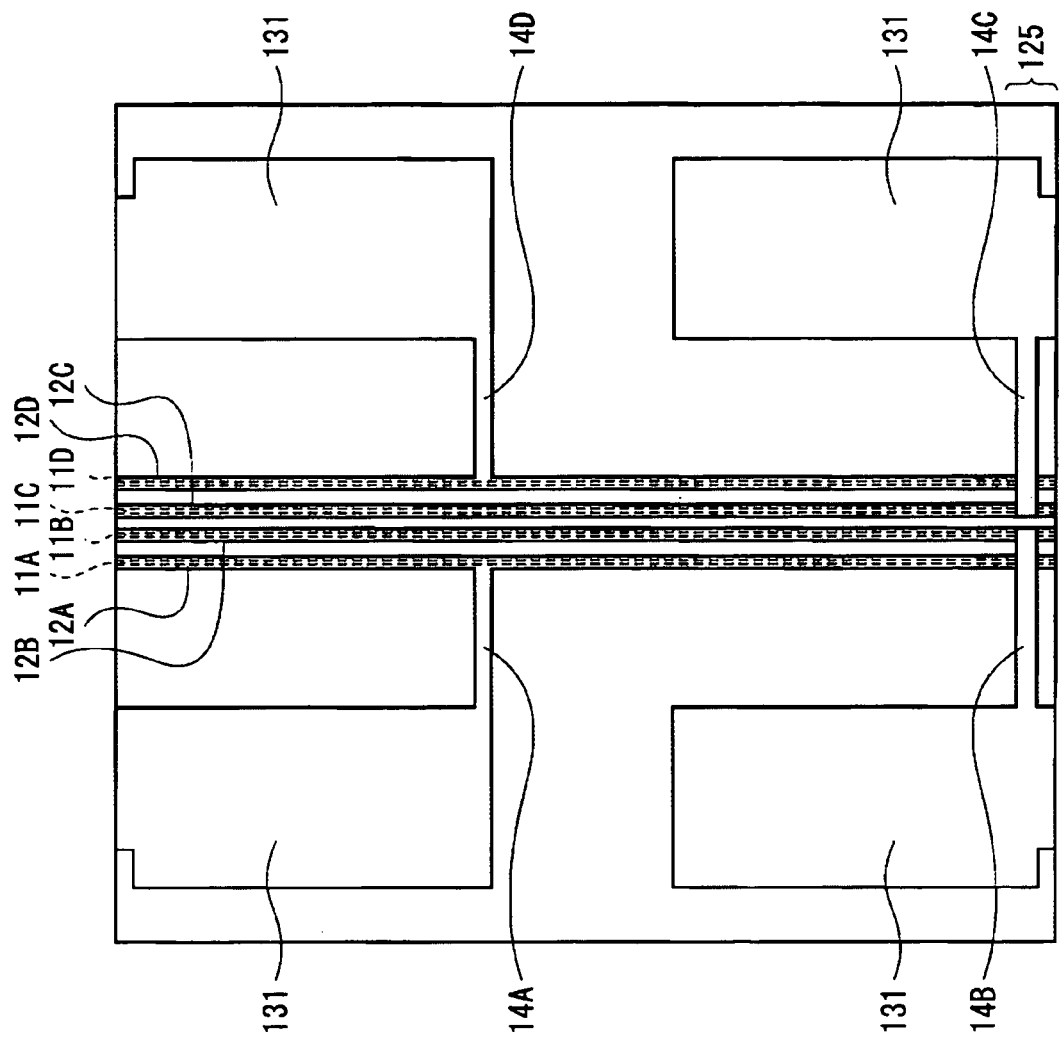
FIG. 34 is a plan view illustrating a step following the step illustrated in FIG. 33.

Subsequently, as illustrated in FIG. 34, the lower pad electrode 131 of the pad electrodes 13B and 13C is formed to avoid the protruding streaks 11A to 11D. The contact electrodes 12B and 12C and the lower pad electrode 131 of the pad electrodes 13B and 13C are connected by the wiring electrodes 14B and 14C (step S302). At this time, the wiring electrodes 14B and 14C are formed in the high-resistivity region 125 on the rear end face of the laser diode device 10.

Figure 35:
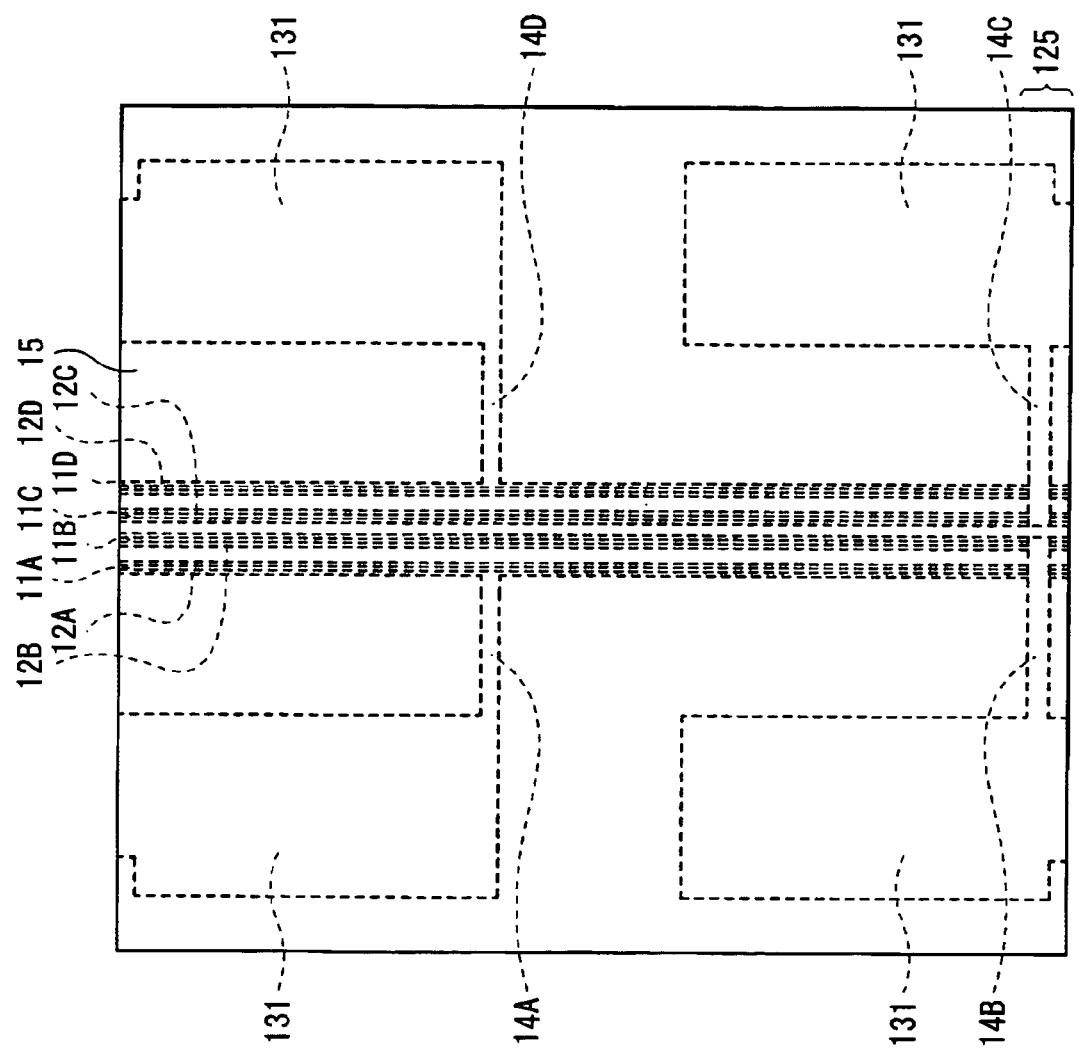
FIG. 35 is a plan view illustrating a step following the step illustrated in FIG. 34.

After that, as illustrated in FIG. 35, the first insulating film 15 that has the foregoing thickness and is configured of the foregoing material is formed on the whole area (step S303).

Figure 36:
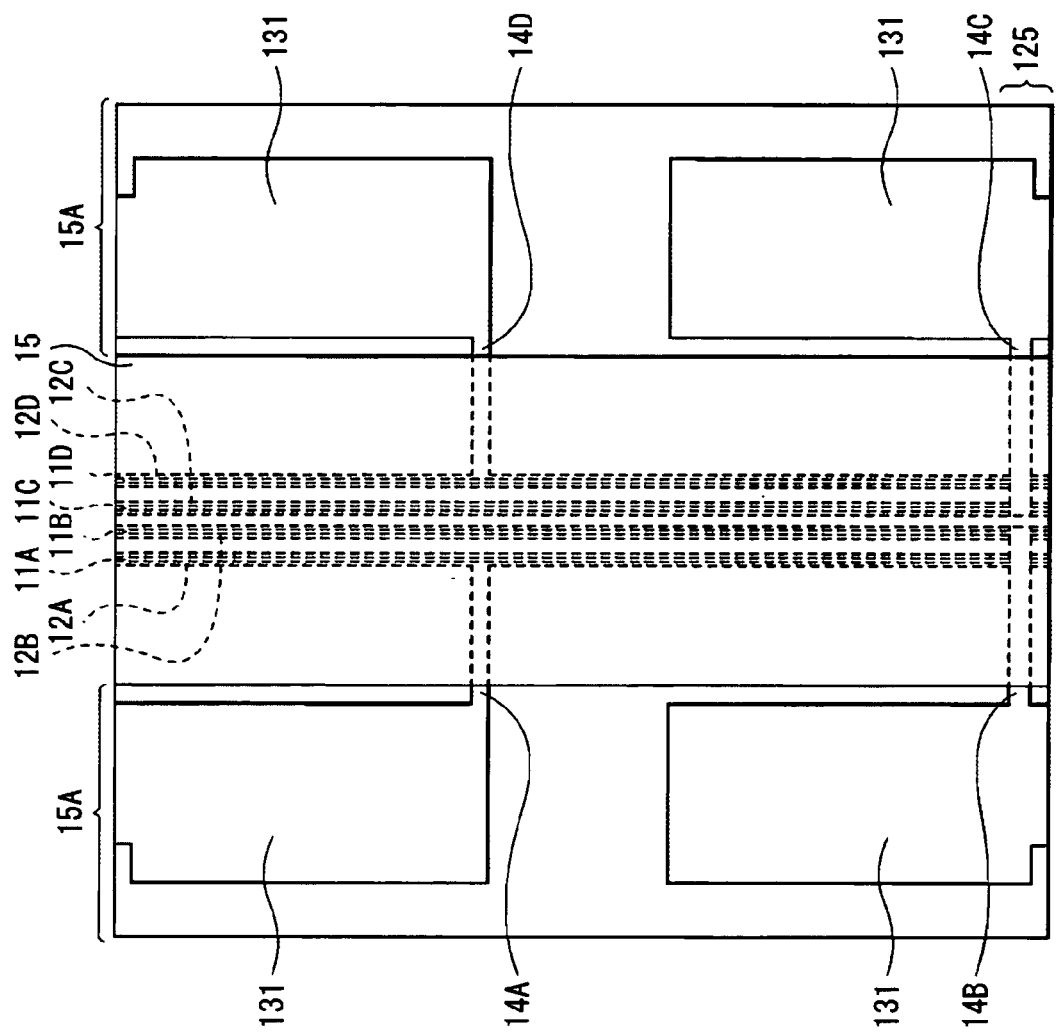
FIG. 36 is a plan view illustrating a step following the step illustrated in FIG. 35.

After that, as illustrated in FIG. 36, the first insulating film 15 on the pad electrodes 13A to 13D is selectively removed to provide the contact hole 15A (step S304). Thereby, the first insulating film 15 is formed on the contact electrodes 12A to 12D.

Figure 37:
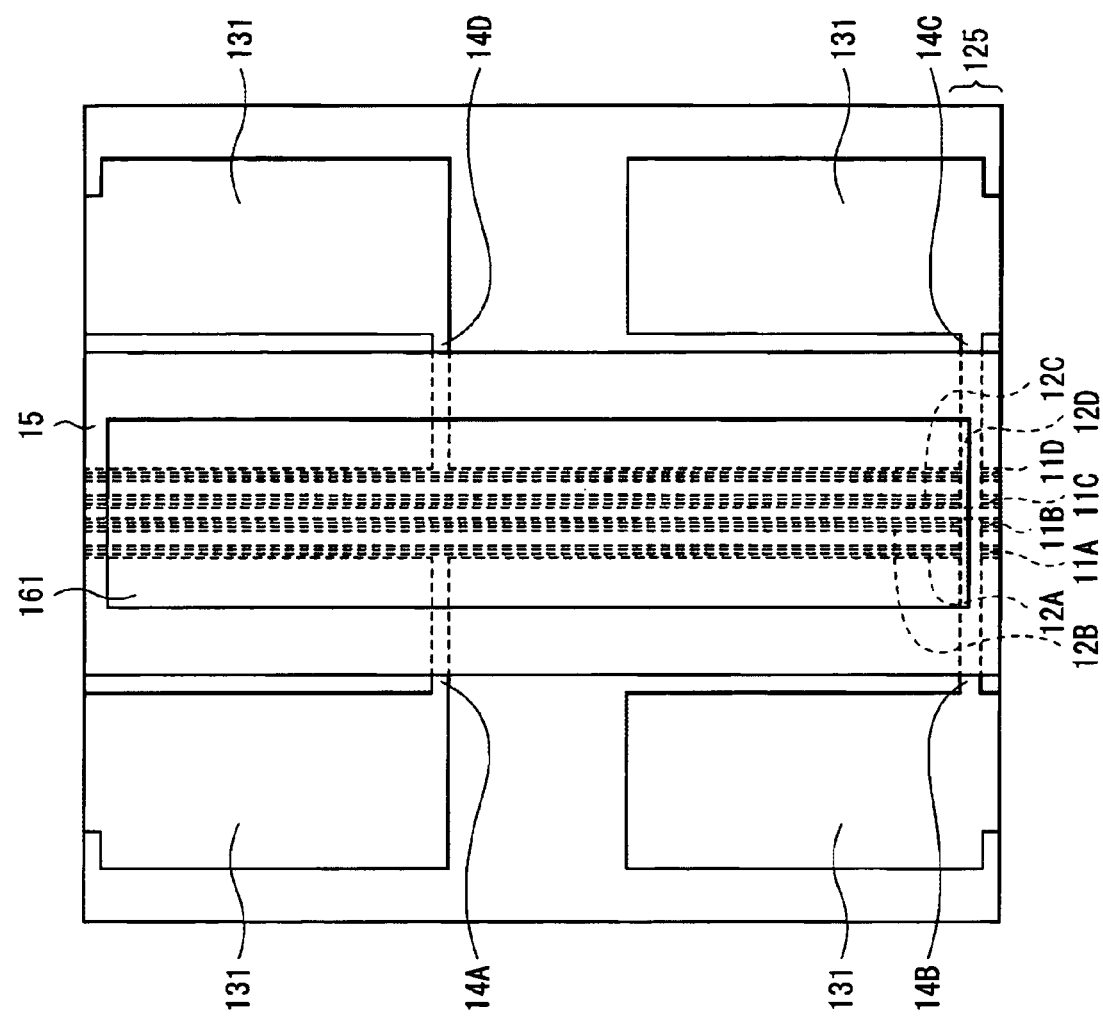
FIG. 37 is a plan view illustrating a step following the step illustrated in FIG. 36.

After the first insulating film 15 is formed, as illustrated in FIG. 37, the lower heat conduction layer 161 that has the foregoing thickness and is configured of the foregoing material is formed on the first insulating film 15 (step S305).

Figure 38:
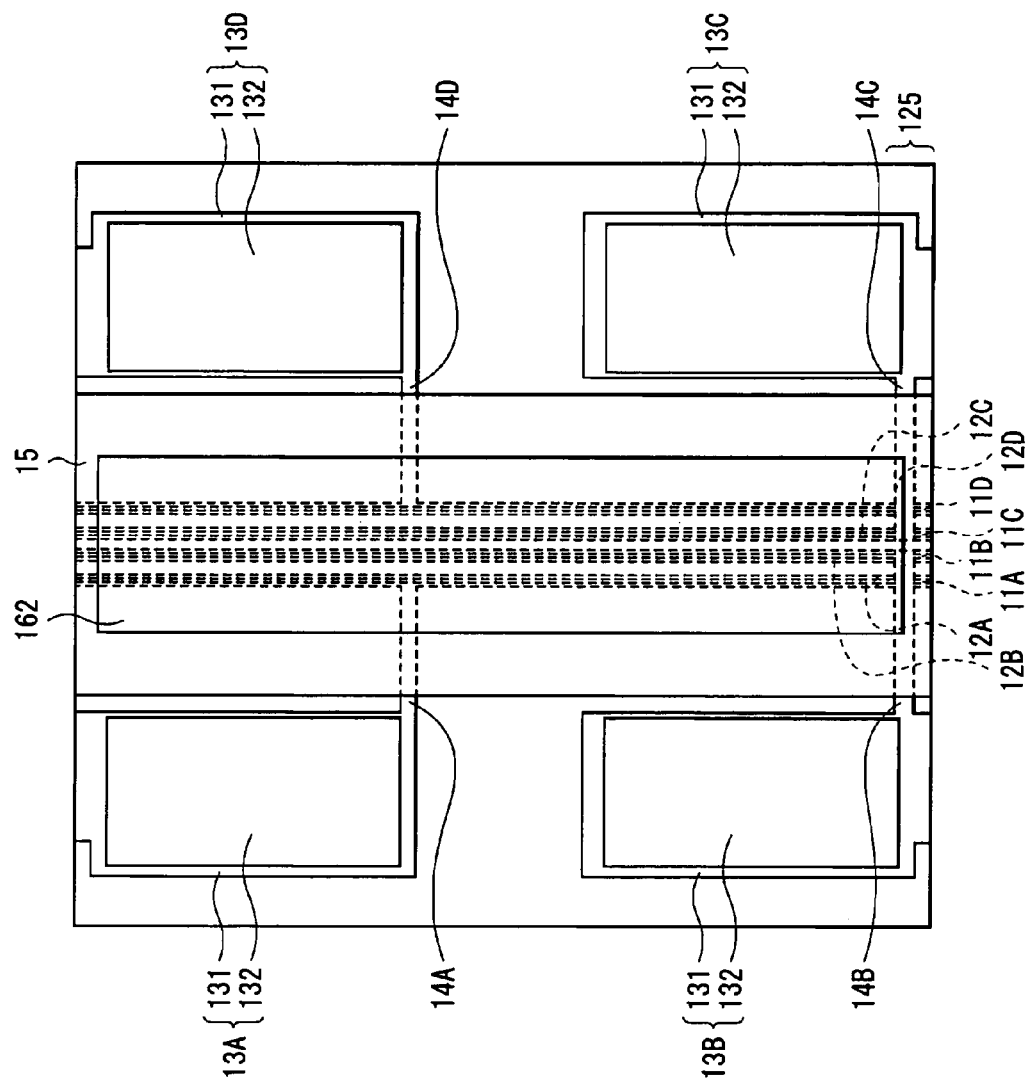
FIG. 38 is a plan view illustrating a step following the step illustrated in FIG. 37.

After the lower heat conduction layer 161 is formed, as illustrated in FIG. 38, the upper pad electrode 132 and the upper heat conduction layer 162 configured of the metal plated layer having the foregoing thickness are respectively formed on the lower pad electrode 131 of the pad electrodes 13A to 13D and the lower heat conduction layer 161 (step S306). Thereby, the pad electrodes 13A to 13D are formed to avoid the protruding streaks 11A to 11D, and the heat conduction layer 16 is formed on the first insulating film 15.

Figure 39:
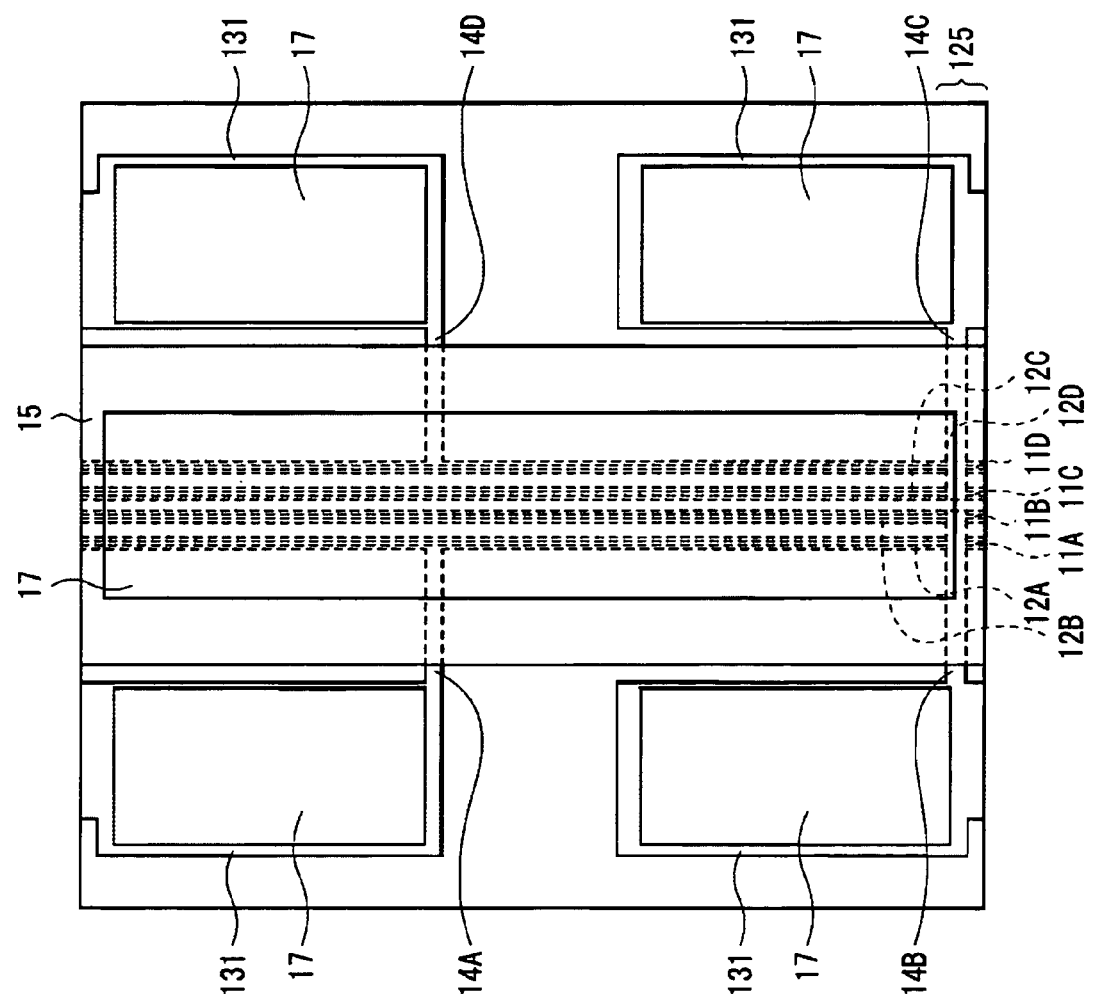
FIG. 39 is a plan view illustrating a step following the step illustrated in FIG. 38.

After the upper pad electrode 132 and the upper heat conduction layer 162 are formed, as illustrated in FIG. 39, the metal layer 17 that has the foregoing thickness and is configured of the foregoing material is formed on the upper pad electrode 132 and the upper heat conduction layer 162 (step S307).

After the metal layer 17 is formed, the rear face side of the substrate 111 is, for example, lapped and polished to decrease the thickness of the substrate 111 down to, for example, about 100 μm (step S308), and the n-side electrode 124 configured of the foregoing material is formed on the rear face of the substrate 111 (step S309). After that, the substrate 111 is adjusted to a given size, and the reflector films (not illustrated) are formed on the opposed pair of resonator end faces.

Subsequently, the support 20 configured of the foregoing material is prepared. As illustrated in FIG. 17, the solder layer 30 configured of the foregoing material is formed on one face of the support 20. After that, the laser diode device 10 is jointed to the support 20 by the solder layer 30 in a state of junction-down that the face on which the protruding streaks 11A and 11B of the laser diode device 10 are formed is opposed to the support 20. Accordingly, the multibeam laser diode of this embodiment is completed.

In the multibeam laser diode, in the case where a given voltage is applied to between the n-side electrode 124 and the contact electrodes 12A to 12D, laser oscillation is generated in the same manner as that in the first embodiment. In this embodiment, since the wiring electrodes 14B and 14C are formed in the high-resistivity region 125 of the laser diode device 10. Thus, even if the four protruding streaks 11A to 11D are formed in the laser diode device 10, the contact electrodes 12A to 12D are driven through the pad electrodes 13A to 13D and the wiring electrodes 14A to 14D without straightly jointing the contact electrodes 12A to 12D to the solder layer 30.

Further, the heat conduction layer 16 configured of a metal is provided on the first insulating film 15. Therefore, heat generated in the laser diode device 10 is released to the solder layer 30 and the support 20 through the heat conduction layer 16.

Further, by providing the first insulating film 15 on the contact electrodes 12A to 12D, stress applied to the protruding streaks 11A to 11D that is generated by providing the contact electrodes 12A to 12D and joint stress between the heat conduction layer 16 and the solder layer 30 applied to the protruding streaks 11A to 11D are decreased. Therefore, effect on polarization characteristics and reliability is decreased.

In particular, the contact electrodes 12A to 12D have a symmetrical width with respect to the protruding streaks 11A to 11D. Therefore, by providing the contact electrodes 12A to 12D, stress applied to the protruding streaks 11A to 11D is further decreased.

As described above, in this embodiment, the wiring electrodes 14B and 14C are formed in the high-resistivity region 125 of the laser diode device 10. Thus, even if the four protruding streaks 11A to 11D are formed in the laser diode device 10, electric connection is enabled without straightly jointing the contact electrodes 12A to 12D to the solder layer 30. Further, the heat conduction layer 16 configured of a metal is provided on the first insulating film 15. Therefore, by jointing the heat conduction layer 16 to the solder layer 30, in the case of junction-down assembly, the heat release characteristics are able to be improved.

Further, by providing the first insulating film 15 on the contact electrodes 12A and 12B, stress applied to the protruding streaks 11A and 11B that is generated by providing the contact electrodes 12A and 12B and joint stress between the heat conduction layer 16 and the solder layer 30 applied to the respective protruding streaks 11A and 11B are able to be decreased. Therefore, effect on polarization characteristics and reliability is able to be decreased.

The descriptions have been hereinbefore given of the invention with reference to the embodiments. However, the invention is not limited to the foregoing embodiments, and various modifications may be made. For example, in the foregoing embodiments, the description has been given of the case that the laser diode device 10 has two or four protruding streaks (11A to 11D). However, the number of the protruding streaks 11A to 11D, that is, the number of beams is not limited to even number such as two or four, but may be odd number such as three or five. Further, the number of the protruding streaks 11A to 11D may be not necessarily the same as the number of the pad electrodes 13A to 13D. For example, in the case where the number of the protruding streaks is smaller than the number of the pad electrodes, a dummy pad electrode not contacted with any contact electrode may be provided. Further, in the case where the number of the pad electrodes is larger than the number of the protruding streaks, one contact electrode may be connected to two or more pad electrodes.

Further, in the foregoing embodiments, the description has been given of the multibeam laser diode as an example. However, the invention is able to be applied to a multiple-wavelength laser.

Further, in the foregoing embodiments, the description has been given of the case that one contact electrode and one pad electrode are connected by one wiring electrode. However, the number of wiring electrodes may be plural.

In addition, the material and the thickness, the film-forming method, the film-forming conditions and the like for the respective layers are not limited to those described in the foregoing embodiments, but other material, other thickness, other film-forming method, and other film-forming conditions may be used. For example, in the foregoing embodiments, the description has been given of the case that the n-type cladding layer 112 and the p-side contact layer 119 are formed by MOCVD method. However, the n-type cladding layer 112 and the p-side contact layer 119 may be formed by other organic metal vapor-phase growth method such as MOVPE method, or may be formed by MBE (Molecular Beam Epitaxy) method or the like.

Furthermore, for example, in the foregoing embodiments, the description has been given of the structure of the laser diode device specifically. However, all layers are not necessarily provided, and other layer may be further provided.

In addition, the invention may be applied not only to AlGaInP red laser, but also a laser with higher output, a laser with other oscillation wavelength, or laser configured of other material.

The present application contains subject matter related to that disclosed in Japanese Priority Patent Application JP 2008-214701 filed in the Japan Patent Office on Aug. 22, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A multibeam laser diode comprising:
a laser diode device including a laser diode device body having a surface and a plurality of protruding streaks projecting from the surface as an integral construction with the laser diode device body and extending longitudinally therealong in a parallel manner, the plurality of protruding streaks disposed adjacent to yet disposed part from one another;
a plurality of contact electrodes, respective ones of the plurality of contact electrodes contacting and covering respective ones of the plurality of protruding streaks in their entirety as viewed in cross-section;
a plurality of pad electrodes disposed on the surface of the laser diode device body with at least one pair of disposed-apart pad electrodes extending longitudinally along the surface parallel to the plurality of protruding streaks, the plurality of protruding streaks disposed between the at least one pair of disposed-apart pad electrodes;
a pair of wiring electrodes, a respective one of the pair of wiring electrodes extending laterally relative to the pair of protruding streaks such that a respective one of the pair of wiring electrodes electrically connects respective adjacent ones of the contact electrodes and the pad electrodes;
a continuously-extending first insulating film contacting and covering the plurality of contact electrodes and the surface of the laser diode device body on both lateral sides of each one of the plurality of protruding streaks as viewed in cross-section; and
a heat conduction layer configured of a metal, the heat conduction layer contacting and covering at least a significant portion of the first insulating film as viewed in cross section, the heat conduction layer continuously extending laterally as viewed in cross-section at least where the first insulating film contacts and covers the plurality of contact electrodes and the surface of the laser diode device body between adjacent ones of the plurality of contact electrodes.

2. The multibeam laser diode according to claim 1, wherein the first insulating film is cofigured of one or more selected from the group consisting of AlN, SiC, diamond, BN, $SiO_2$, and SiN.

3. The multibeam laser diode according to claim 2, wherein the respective one of the pair of wiring electrodes connects the each one of the plurality of the contact electrodes to the one or more of the plurality of pad electrodes, has a symmetrical width with respect to the protruding streaks.

4. The multibeam laser diode according to claim 3, wherein the respective one of the pair of wiring electrodes connects the the each one of the plurality the contact electrodes to one or more of the plurality of pad electrodes, skipping over other contact electrode, and the other contact electrode is insulated from the wiring electrode by a second insulating film.

5. The multibeam laser diode according to claim 4, wherein the second insulating film is configured of one or more selected from the group consisting of AlN, SiC, diamond, BN, $SiO_2$, and SiN.

6. The multibeam laser diode according to claim 3, wherein the respective one of the pair of wiring electrodes connects the each one of the plurality of the contact electrodes to one or more of the plurality of pad electrodes, skipping over other contact electrode, and the wiring electrode is formed in a high-resistivity region in the laser diode device.

7. The multibeam laser diode according to claim 6, wherein the high-resistivity region is a region provided with one or both of ion implantation and removing a p-side contact layer.

8. The multibeam laser diode according to claim 3 comprising:
a support; and
a solder layer between the support and each one of the plurality of the pad electrodes and between the support and the heat conduction layer.

9. The multibeam laser diode according to claim 2 comprising:
a support; and
a solder layer between the support and each one of the plurality of the pad electrodes and between the support and the heat conduction layer.

10. The multibeam laser diode according to claim 1, wherein each one of the plurality of the contact electrodes has a symmetrical width with respect to the protruding streaks.

11. The multibeam laser diode according to claim 10, wherein the respective one of the pair of wiring electrodes connects the each one of the plurality of the contact electrodes to one or more of the plurality of pad electrodes, skipping over other contact electrode, the said other contact electrode is insulated from the wiring electrode by a second insulating film.

12. The multibeam laser diode according to claim 11, wherein the second insulating film is configured of one or more selected from the group consisting of AlN, SiC, diamond, BN, $SiO_2$, and SiN.

13. The multibeam laser diode according to claim 10, wherein the respective one of the pair of wiring electrodes connects the each one of the plurality of the contact electrodes to one or more of the plurality of pad electrodes, skipping over other contact electrode, and the wiring electrode is formed in a high-resistivity region in the laser diode device.

14. The multibeam laser diode according to claim 13, wherein the high-resistivity region is a region provided with one or both of ion implantation and removing a p-side contact layer.

15. The multibeam laser diode according to claim 10 comprising:
- a support; and
- a solder layer between the support and each one of the plurality of the pad electrodes and between the support and the heat conduction layer.

16. The multibeam laser diode according to claim 1 comprising:
- a support; and
- a solder layer between the support and each one of the plurality of the pad electrodes and between the support and the heat conduction layer.

* * * * *